(12) United States Patent
Theobald et al.

(10) Patent No.: US 8,687,359 B2
(45) Date of Patent: Apr. 1, 2014

(54) PORTABLE COMPUTER UNIFIED TOP CASE

(75) Inventors: Matthew Theobald, San Francisco, CA (US); Jonathan P. Ive, San Francisco, CA (US); Bartley K. Andre, Menlo Park, CA (US); Christopher Stringer, Woodside, CA (US); Daniel J. Coster, San Francisco, CA (US); John Raff, Menlo Park, CA (US); Ron Hopkinson, Campbell, CA (US); John Brock, San Francisco, CA (US); Chris Ligtenberg, San Carlos, CA (US); Michelle Rae Goldberg, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/353,242

(22) Filed: Jan. 13, 2009

(65) Prior Publication Data

US 2010/0091442 A1    Apr. 15, 2010

Related U.S. Application Data

(60) Provisional application No. 61/105,035, filed on Oct. 13, 2008.

(51) Int. Cl.
*G06F 1/16*    (2006.01)
*H05K 5/00*    (2006.01)
*H05K 7/00*    (2006.01)

(52) U.S. Cl.
USPC ................................ 361/679.55; 361/679.02

(58) Field of Classification Search
USPC ......... 361/679.55; 455/575.1–575.4; 29/17.1, 29/17.3, 52.5, 59, 458, 469.5, 421.1, 29/592.1, 825, 832
See application file for complete search history.

(56) References Cited

U.S. PATENT DOCUMENTS

| | | |
|---|---|---|
| 3,555,168 A | 1/1971 | Frykberg |
| 4,319,795 A | 3/1982 | Klaus |
| 4,831,498 A | 5/1989 | Baba |

(Continued)

FOREIGN PATENT DOCUMENTS

| | | |
|---|---|---|
| CN | 1431861 | 7/2003 |
| CN | 1616709 | 5/2005 |

(Continued)

OTHER PUBLICATIONS

Wikipedia contributors, "Machining", Wikipedia, The Free Encyclopedia, May 11, 2012, 21:18 UTC, <http://en.wikipedia.org/w/index.php?title=Machining&oldid=492078469> [accessed May 11, 2012].

(Continued)

*Primary Examiner* — Adrian S Wilson
(74) *Attorney, Agent, or Firm* — Womble Carlyle Sandridge & Rice LLP

(57) ABSTRACT

A top case assembly for a portable computer is disclosed. The assembly may include an integral unified (e.g., homogenous) top case formed from a single part. The integral top case provides an enclosure, frame and cosmetic exterior of the portable computer. The integral top case also serves as the primary structure of the portable computer. The assembly may include a variety of subassemblies such as keyboards, touchpads, circuit boards, and drives that are carried by the underside of the integral top case. The integral top case may be formed from aluminum slab that has been machined to form walls, openings, attachment areas and cosmetic areas of the top case.

18 Claims, 18 Drawing Sheets

(56) References Cited

U.S. PATENT DOCUMENTS

| | | | |
|---|---|---|---|
| 4,832,349 A | 5/1989 | Kawai et al. | |
| 4,839,837 A | 6/1989 | Chang | |
| 4,873,022 A | 10/1989 | Ogawa et al. | |
| 5,008,485 A | 4/1991 | Kitagawa | |
| 5,008,486 A | 4/1991 | Terakawa et al. | |
| 5,128,835 A | 7/1992 | Rudy, Jr. et al. | |
| 5,164,542 A | 11/1992 | Hart | |
| 5,170,009 A | 12/1992 | Kadokura | |
| 5,176,853 A | 1/1993 | Sarma et al. | |
| 5,237,486 A * | 8/1993 | LaPointe et al. | 361/679.27 |
| 5,364,196 A | 11/1994 | Baitz et al. | |
| 5,574,625 A | 11/1996 | Ohgami et al. | |
| 5,666,261 A | 9/1997 | Aguilera | |
| 5,676,812 A | 10/1997 | Kadokura | |
| 5,687,055 A | 11/1997 | Miki | |
| 5,715,139 A * | 2/1998 | Nakajima | 361/679.55 |
| 5,731,541 A | 3/1998 | Bernd et al. | |
| 5,731,963 A | 3/1998 | Heiss et al. | |
| 5,847,317 A | 12/1998 | Phelps | |
| 5,946,194 A | 8/1999 | Dudas et al. | |
| 5,953,206 A | 9/1999 | Jondrow | |
| 6,125,029 A | 9/2000 | Sasaki et al. | |
| 6,151,207 A | 11/2000 | Kim | |
| 6,233,825 B1 | 5/2001 | Degroot | |
| 6,243,261 B1 | 6/2001 | Janik et al. | |
| 6,266,240 B1 | 7/2001 | Urban et al. | |
| 6,303,854 B1 | 10/2001 | Papaleo et al. | |
| 6,323,418 B1 | 11/2001 | Tiburtius et al. | |
| 6,375,026 B1 * | 4/2002 | Sheldrake et al. | 220/4.02 |
| 6,459,591 B2 * | 10/2002 | Liu | 361/756 |
| 6,480,397 B1 * | 11/2002 | Hsu et al. | 361/814 |
| 6,483,719 B1 | 11/2002 | Bachman | |
| 6,547,252 B1 | 4/2003 | Kahl et al. | |
| 6,574,096 B1 | 6/2003 | Difonzo et al. | |
| 6,583,389 B2 * | 6/2003 | Murooka et al. | 219/216 |
| 6,624,353 B2 | 9/2003 | Gabower | |
| 6,624,975 B2 * | 9/2003 | Morita et al. | 360/132 |
| 6,693,770 B2 * | 2/2004 | Morita et al. | 360/132 |
| 6,694,594 B2 * | 2/2004 | Chung et al. | 29/469.5 |
| 6,802,952 B2 | 10/2004 | Hsu | |
| 6,900,984 B2 * | 5/2005 | Merz et al. | 361/679.55 |
| 6,914,982 B2 * | 7/2005 | Toyoda et al. | 379/433.13 |
| 7,012,189 B2 | 3/2006 | Kriege et al. | |
| 7,046,507 B2 | 5/2006 | Nakamura et al. | |
| 7,075,785 B2 * | 7/2006 | Minaguchi et al. | 361/679.09 |
| 7,209,195 B2 * | 4/2007 | Lin | 349/58 |
| 7,310,872 B2 * | 12/2007 | Kriege et al. | 29/825 |
| 7,382,612 B2 * | 6/2008 | Chan et al. | 361/679.41 |
| 7,385,806 B2 | 6/2008 | Liao | |
| 7,636,244 B2 | 12/2009 | Kriege et al. | |
| 7,886,437 B2 | 2/2011 | Nashner et al. | |
| 8,009,415 B2 | 8/2011 | Xia et al. | |
| 8,089,755 B2 * | 1/2012 | Luke et al. | 361/679.56 |
| 8,110,152 B2 * | 2/2012 | Schultz et al. | 422/177 |
| 8,341,832 B2 * | 1/2013 | Theobald et al. | 29/825 |
| 2001/0015005 A1 | 8/2001 | Chung et al. | |
| 2001/0032835 A1 * | 10/2001 | Murooka et al. | 219/216 |
| 2001/0038523 A1 | 11/2001 | Bang | |
| 2002/0006031 A1 * | 1/2002 | Liu | 361/756 |
| 2003/0062811 A1 * | 4/2003 | Peker et al. | 312/223.1 |
| 2003/0089616 A1 | 5/2003 | Hsu | |
| 2003/0162046 A1 * | 8/2003 | Kimura et al. | 428/556 |
| 2005/0023022 A1 * | 2/2005 | Kriege et al. | 174/52.4 |
| 2005/0106403 A1 | 5/2005 | Yui | |
| 2006/0176659 A1 * | 8/2006 | Sun et al. | 361/683 |
| 2006/0268502 A1 * | 11/2006 | Liu et al. | 361/683 |
| 2007/0025072 A1 * | 2/2007 | Liao | 361/683 |
| 2007/0177345 A1 * | 8/2007 | Iikubo et al. | 361/683 |
| 2007/0230101 A1 * | 10/2007 | Wong et al. | 361/683 |
| 2008/0037771 A1 * | 2/2008 | Black et al. | 379/433.01 |
| 2008/0289178 A1 | 11/2008 | Nashner et al. | |
| 2009/0116181 A1 * | 5/2009 | Luke et al. | 361/679.26 |
| 2009/0153469 A1 * | 6/2009 | Wang et al. | 345/156 |
| 2010/0124007 A1 * | 5/2010 | Yamamoto et al. | 361/679.08 |

FOREIGN PATENT DOCUMENTS

| | | |
|---|---|---|
| CN | 201035465 | 3/2008 |
| DE | 202 18 206 | 2/2003 |
| JP | 11-145440 | 5/1999 |
| JP | 2001318735 | 11/2001 |
| JP | 2004335644 | 11/2004 |
| WO | 99/47993 | 9/1999 |
| WO | 02/27448 | 4/2002 |
| WO | WO 02/27448 | 4/2002 |

OTHER PUBLICATIONS

Wikipedia contributors, "Stamping (metalworking)", Wikipedia, The Free Encyclopedia, May 6, 2012, 10:10 UTC, <http://en.wikipedia.org/w/index.php?title=Stamping_(metalworking)&oldid=490959324> [accessed May 11, 2012].

Tsai et al, "Die Design for Stamping a Notebook Case with Magnesium Alloy", Journal of Materials Processing Technology 201 (2008) 247-251.

Examiner's First Report on Australian Patent Application No. 2009303576, dated May 17, 2012, 2 pp.

Office Action for U.S. Appl. No. 12/353,242 dated Oct. 12, 2010.

International Search Report for PCT/US2009/060395 dated Dec. 18, 2009.

KR Office Action, 10-2011-7009050, Mailed Oct. 30, 2012.

JP Office Action, 2011-531246, Mailed Dec. 19, 2012.

CN Office Action, 200980146445.8, Mailed Dec. 24, 2012.

Australian Application No. 2009303576—Examiners Second Report mailed Jun. 24, 2013.

* cited by examiner

PORTABLE COMPUTER UNIFIED TOP CASE

This application claims the benefit of provisional patent application No. 61/105,035, filed Oct. 13, 2008, which is hereby incorporated by reference herein in its entirety.

Background

The present invention relates generally to portable computing devices such as notebook computers. More particularly, the present invention relates to enclosures for portable computing devices and to methods for assembling portable computing devices.

Designers of portable computers are faced with competing demands. For example, it is generally desirable to reduce the weight of a portable computer, so that a user is not burdened by an overly heavy device. At the same time, durability and aesthetics should not suffer. Often, weight can be saved, but only at the expense of reducing the size or strength of device components. Similarly, it may be possible to improve device appearance, but only at the expense of making a device more fragile and susceptible to damage. For example, it can be difficult to form robust computer enclosures while satisfying desired performance and appearance criteria.

Conventional computer enclosures are formed by assembling multiple pieces to create a single enclosure. However, enclosures formed from multiple pieces add size, weight, complexity, can be relatively expensive, and can require an excessive amount of time to assemble the portable computer and the portable computer's enclosure. In addition, computer enclosures formed from multiple pieces assembled together have a relatively high probability of failure because the entire enclosure may fail if any single piece fails (e.g., because there are multiple failure points). Moreover, conventional computer enclosures can be difficult to recycle and therefore can be burdensome on the environment. For example, some of the pieces used to form the enclosure are typically formed non-recyclable materials that have to be removed from the enclosure before recycling. In addition, if the pieces are formed from different materials, the pieces may need to be separate and sorted before recycling. Glues and/or welding materials used to hold the pieces of the computer enclosure together may also interfere with recycling the enclosure.

It would therefore be desirable to be able to provide improved enclosures that are more cost effective, smaller, lighter, stronger and aesthetically more pleasing than current enclosure designs. In addition, there is a need for improvements in the manner in which structures are mounted within the enclosures. For example, there is a need for improvements that enable structures to be quickly and easily installed within the enclosure, and that help position and support the structures in the enclosure.

SUMMARY

A top case assembly for a portable computer is disclosed. The assembly may include an integral unified (e.g., homogenous) top case formed from a single part. The integral top case provides an enclosure, frame and cosmetic exterior of the portable computer. The integral top case also serves as the primary structure of the portable computer. The assembly may include a variety of subassemblies such as keyboards, touchpads, circuit boards, and drives that are carried by the underside of the integral top case. The integral top case may be formed from a metal part such as an aluminum slab or an aluminum core that has been machined to form walls, openings, attachment areas, and cosmetic areas of the top case.

DETAILED DESCRIPTION

Figure 1A:
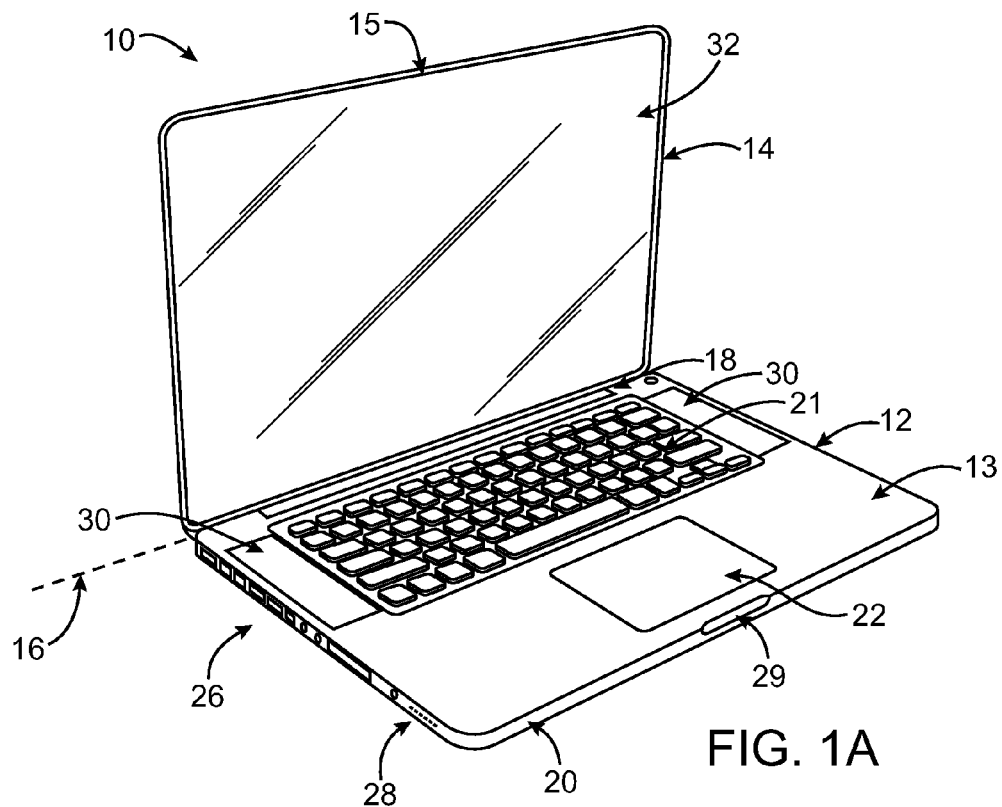
FIGS. 1A and 1B are perspective views of an illustrative portable computer that may have a unified top case in accordance with an embodiment of the present invention.

The present invention relates to portable computer structures. Portable computer structures may be provided that enhance the functionality of a portable computer while retaining or even improving desired levels of durability and aesthetics.

One aspect of the invention may relate to a portion of portable electronic device that includes an enclosure formed by two parts (e.g., top case and bottom case). In one embodiment, a majority if not all of the internal components such as electrical components of the portion of the portable electronic device are assembled within the top case (sometimes referred to as the upper portion of the computer's base unit) while the bottom case only serves as a cover that cooperates with the top case assembly to fully enclose the internal components (e.g., they cooperate to form the enclosure of the portion of the electronic device). The top case may carry the electrical components. The electrical components may be layered. The top case may include attachment features on its underside for securing the electrical components.

Another aspect of the invention may relate to a housing portion (e.g., top case) that unifies several structural/ornamental features into a single integral part. For example, the housing portion may serves as a protective shell with an integral frame while providing the cosmetic exterior. With this type of arrangement, the housing portion (e.g., primary case 20) may serve as an exoskeleton for a portable computer such as a laptop computer that provides structural strength while providing the cosmetic exterior. These three features may work together in one single part. The housing portion may also provide integral mounting features for helping secure various subassemblies within/to the housing portion. The housing portion may also serve as a heat sink to the portable electronic device.

In one embodiment, the integral housing portion may be formed from a single slab of material, and more particularly a single slab of metal material and even more particularly a single slab of aluminum material. This may, for example, be accomplished with one or more machining operations. A majority if not all of the surfaces of the integral housing portion may be machined or otherwise formed. As an example, slabs may, for example, be formed via an extrusion or similar process. Slabs may generally have a similar profile as the profile of the integral housing portion (e.g., side view, top view, front view).

If desired, the integral housing portion may be formed from an aluminum core which may be referred to as a near-net-shape aluminum core. This type of aluminum core may be formed from a piece of aluminum that is similar in shape to the final shape of the integral housing portion. That is, an aluminum core may follow the contour or form of the integral housing portion (e.g., the integral housing portion and the aluminum cores may both have structures such as walls that are generally the same in shape in size). Relatively less material may need to be removed from the aluminum core than an aluminum slab to form the integral housing portion (e.g., an aluminum slab may have a substantially rectangular shape while an aluminum core may have a near-net shape similar to the shape of the integral housing portion). Because of this, forming the integral housing portion from an aluminum core may reduce the amount of material that is machined away (i.e., cut away) and thereby reduce the amount of material such as machine cuttings that would otherwise need to be disposed of or recycled.

The terms core, slab, aluminum core, aluminum slab, and billet may be used interchangeably herein. For example, a piece of material referred to as a slab may also be referred to as a core without altering the attributes of the piece of material.

Aluminum cores that are similar in shape to the final shape of the integral housing portion may be formed using any suitable method. For example, an aluminum core may be formed using processes such as a rough forging, a forging, a casting, a stamping, an investment casting, an extruding process, etc. This type of arrangement may help to reduce waste during manufacturing.

When the integral housing portion (e.g., primary case 20) is formed from an aluminum slab (e.g., a rectangular piece of unfinished aluminum), the finished integral housing portion may have a weight that is about 60% less or 50% less than the weight of the raw aluminum slab (or 40% less, 30% less, 20% less, etc.). When the integral housing portion is formed from an aluminum core (e.g., a casting) that already has the rough shape of the integral housing portion, the integral housing portion may have a weight that is 50% or 30% less than the weight of the original aluminum core (or 20% less, 10% less, etc.). These are merely illustrative examples. Any suitable amount of material may be removed from the original metal part when forming the unified top case if desired.

Embodiments of the invention are discussed below with reference to FIGS. 1-9. However, those skilled in the art will readily appreciate that the detailed description given herein with respect to these figures is for explanatory purposes as the invention extends beyond these limited embodiments.

FIG. 1 is a diagram of a portable computer 10, in accordance with one embodiment of the invention. Portable computer 10 may, for example, correspond to a laptop or notebook computer. As shown, portable computer 10 may include a base or main unit 12 and a lid or cover 14. The lid 14 may rotate relative to base 12 about rotational axis 16. The lid may, for example, be pivotally (rotatably) coupled to the base via a hinge or clutch barrel 18. As such, the lid 14 may rotate into an open position (as shown) or a closed position (not shown) relative to the base 12. The hinge 18 may be configured to hold the lid 14 in various positions relative to the base 12.

The internal components of the base 12 and lid 14 may be surrounded at a peripheral region by a housing 13 and 15, respectively, that serves to support the internal components of the respective devices in their assembled position. That is, the housings 13 and 15 may enclose and support internally various components (including for example integrated circuit chips and other circuitry) to provide computing operations for the portable computer 10. The housings 13 and 15 may also help define the shape or form of the portable computer 10. That is, the contour of the housings 13 and 15 may embody the outward physical appearance of the portable computer 10. As such, they may include various ornamental features that improved the aesthetical appearance of the portable computer in both open and closed positions.

In some instances, the internal components of the base 12 and lid 14 may generate unwanted electrical emissions (EMI), and therefore, housings 13 and 15 may be configured to contain electronic emissions therein. By way of example, the housing may be formed from a suitable shielding material, i.e., a conductive material and/or a non-conductive material coated with a conductive material. In other instances, the internal components may generate undesirable heat, and therefore, the housings may be configured to disperse the heat (e.g., transfer heat away from a heat producing element through portions of the housing).

Housings 13 and 15, which may sometimes be referred to as cases or casings, may be formed from one or more individual structures. Referring to housing 13 for example, housing 13 may include a primary case 20 and a cover 25 that cooperate to form the housing 13. The primary case 20 may provide the primary structure of the portable computer. For example, it may support the lid 14 as well as carry a majority if not all of the internal components of the base 12 as well as the covers 25. The primary case 20 may serve as the enclosure, frame, and cosmetic exterior (very rigid structure). The covers 25 help close off the space provided by the primary housing. In some embodiments, some portion of the covers 25 may act as a removable portion 25 such as a door for providing access to internal space inside the housing 13 or a removable component such as a battery. The removable portion 25 may be opened/locked via a latch arrangement 27.

Housing 13 and its associated components may, in general, be formed from any suitable materials such as such as plastic, ceramics, metal, glass, etc. The material selected generally depends on many factors including but not limited to strength (tensile), density (lightweight), strength to weight ratio, Young's modulus, corrosion resistance, formability, finishing, recyclability, tooling costs, design flexibility, manufacturing costs, manufacturing throughput, reproducibility, and/or the like. The material selected may also depend on electrical conductivity, thermal conductivity, combustibility, toxicity, and/or the like. The material selected may also depend on aesthetics including color, surface finish, weight, etc.

In accordance with one embodiment, the housing may be formed from a metal material, and further a machinable and recyclable metal material.

In one particular embodiment, the housing may be formed from aluminum. Some of the reasons for using aluminum over other materials is that it is light weight and structurally stronger (e.g., it has very good mechanical properties and strength to weight ratio). This is especially important for portable devices. Other reasons for using aluminum include: reduced tooling costs, its easily formable and extruded in a wide variety of shapes including hollow parts, easily machinable thus making it easy to alter the part and produce tight tolerances, provides a near net shape, offers superior corrosion resistance, it has high scrap value and is routinely reprocessed to generate new products, it can be finished using a variety of methods including mechanical and chemical prefinishes, anodic coatings, paints and electroplated finishes.

In one particular embodiment, the primary case 20 may be formed from a solid block or core of machined aluminum or other suitable metal. An advantage of forming housing 12 at least partly from aluminum is that aluminum is lightweight, machinable, durable and attractive in appearance. Aluminum may be anodized to form an insulating oxide coating.

Machining may be performed to achieve various effects as for example (1) to shape the enclosure and/or (2) to obtain a high degree of dimensional accuracy and surface finish and/or (3) to create openings and/or (4) to create structural features and/or (5) to create attachment features and/or (6) to create desired internal areas, and/or the like. The machining process may include one or more rough machining steps that remove a majority of material and create a flat part and then one or more a fine machining steps to create the final shape. One or more computer numerical control (CNC) machine tools may be used to perform some or all of the machining operations.

The base 12 may be configured to carry and provide access to a variety of components. As shown, the base 12 may be configured to carry a variety of input devices such as a keyboard 21 and a track pad or touch pad 22. In one embodiment, the keyboard 21 and track pad 22 may be located in a top portion of the primary casing 20. The track pad 22 may be situated in the front of the top portion (or palm rest) of the primary casing 20, and the keyboard 21 may be situated in a back of the top portion of the primary casing 20.

The keyboard 21, which includes a plurality of keys, allows a user of the portable computer 10 to enter alphanumeric data. In one embodiment, the keyboard 21 may be arranged as a webbed keyboard, which includes a plurality of spatially separated keys. The webbed keyboard structure that surrounds the keys may, for example, be integrated into the primary case 20 of the base 12. That is, the top surface of the primary case 20 may have key openings that form a webbed structure that surrounds the keys of the keyboard (defines the area between the key openings/keys). In one implementation, the key openings may be formed via a machining operation that cuts holes through a top surface of the primary housing. Alternative cutting operations may also be used in place of or in combination with the machining operation.

The track pad 22 may allow a user to move an input pointer on a graphical user interface in addition to gesturing and allowing a user to make a selection on a graphical user interface. In one embodiment, the track pad 22 may provide a mechanical clicking action for further inputting (e.g., button inputting). In this manner, the track pad 22 can include a single unbroken surface that provides larger real estate for tracking finger movements. Furthermore, the touch pad 22 may be configured to be multi-touch, sensing more than one finger at a time. The track pad 22 may be accessible through an opening in the top surface of the primary housing 20. In one implementation, the key openings may be formed via a machining operation that cuts holes through a top surface of the primary housing. Alternative cutting operations may also be used in place of or in combination with the machining operation.

The base 12 may also be arranged to carry a disk drive 24 for performing various functions related to the portable computer 10. By way of example, the disk drive 24 may be an optical disc drive configured to work with optical discs such as CD's (e.g., CD, CDR, CD-RW, Video CD, etc.), DVD's (e.g., DVD, DVD-audio, DVD-video, DVD-15 RW, etc.), mini-discs, magneto-optical discs and the like. The disk drive 24 may be a slot loaded drive. By slot loaded, it is meant that the disk is inserted directly into the drive rather than by an external retractable tray that moves in and out of the drive. As such, the primary case 20 of the base 12 may includes a disk opening that allows a disk to be placed in the disk drive 24 housed within the base. In one implementation, the disk opening or slot may be formed via a machining operation that cuts through a side wall of the primary housing. Alternative cutting operations may also be used in place of or in combination with the machining operation.

The base 12 may also be configured to carry various ports 26 to which cables/connectors can be connected (e.g., universal serial bus ports, an Ethernet port, a Firewire port, audio jacks, card slots, etc.). The primary casing 20 may include various port openings that allow external cables/connectors to mate with the ports of the base. Buttons and other controls may also be situated within the primary casing 20 of the base 12. These may be situated within openings in the primary housing 20. In one implementation, the openings for ports, buttons and controls may be formed via a machining operation that cuts holes through a wall of the primary housing. Alternative cutting operations may also be used in place of or in combination with the machining operation.

The base 12 may also be configured to carry various indicator lights 28 to display status information to a user. The indicator lights 28 may include windows or holes on micro or macro level through which light may be emitted from one or more light sources (e.g., light-emitting diodes). Depending on the size, machining operations or other cutting operations such as laser cutting may be used to form the windows or holes. The windows and holes may include a transparent material therein.

The base 12 may also be configured to carry speakers and microphone 30 for outputting and inputting sound information to/from the user. The primary case 20 may include various openings to allow sound to pass through the walls of housing 13. With one illustrative arrangement, speaker openings may be formed in the housing of base by creating an array of small openings (perforations) in the surface of housing 12. Depending on the size, machining operations or other cutting operations such as laser cutting may be used to form the speaker openings.

The base 12 may include a lip 29 for gripping the lid 14 when closed. In one implementation, the lip 29 may be formed via a machining operation that removes material from a front wall of the primary housing (at the edge proximate the closed lid 14).

The base 12 may also include one or more feet 31 for supporting the portable computer on a flat surface. The feet 31 may, for example, be placed near the corners of the bottom surface of the cover 25 and removable portion 26. The feet may, for example, be bumpers that are attached to the bottom surfaces.

Although not shown, the base 12 may be configured to carry additional components such as hard drive, battery, main logic board (MLB), and the like. In one embodiment, a majority if not all of these internal components are carried by the primary housing 20 of the base 12. The primary housing may, for example, include various internal features for helping secure these internal components thereto (e.g., slots, undercuts, tabs, bosses, etc.). In one implementation, these features may be formed via a machining operation that removes material inside surfaces of the primary housing. Other removal operations may also be used in place of or in combination with the machining operation.

Furthermore, although not shown, the base may include various frame components and/or internal walls to increase its rigidity and strength. The frame components and/or walls are often internal features disposed within the base 12, and more particularly the primary case 20. In one embodiment, the frame components may be integral frame component (e.g., the frame components may be integrated with the primary case into a single unified piece). In one implementation, these features may be formed via a machining operation that removes material inside surfaces of the primary housing. Other removal operations may also be used in place of or in combination with the machining operation.

Although the lid 14 may include some of the aforementioned components, the lid 14 may be configured to carry a display 32 for presenting graphical information to a user. The display 32 may be covered by or mounted within the housing 15 of the lid 14. In one implementation, the display 32 includes a hinge portion that interfaces with a hinge portion of the primary housing of the base 12 to allow the lid to rotate relative to the base. In this manner, the housing 15 is carried by the display 32. Alternatively, the housing may include a hinge portion. As shown, the display 32 may be visible to a user of the portable computer 10 when the lid 14 is in the open position and no longer visible to the user when the lid 14 is in a closed position. Display 32 may be, for example, a liquid crystal display (LCD), organic light emitting diode (OLED) display, or plasma display (as examples).

In some embodiments, a glass panel may be mounted in front of display 32. The glass panel may help add structural integrity to computer 10. For example, the glass panel may make the lid 14 more rigid and may protect display 32 from damage due to contact with keys or other structures. In one embodiment, the glass panel may be formed from recyclable glass. In one embodiment, the glass panel may substantially fill the entire front surface of the lid 14. That is, the glass panel may extend substantially from one edge to the opposite edge of the lid 14. In these embodiments, the housing 15 may include a minimal side edge that surrounds the glass panel (e.g., different from an extended surface that consumes a portion of the front of the lid). This allows the display area to be maximized while providing an aesthetically pleasing look to the lid 14 (e.g., a black edge).

In accordance with one embodiment, the primary case 20 serves as the primary structure of the entire portable computer 10. That is, it supports the components of the base 12 and the lid 14 in addition provides strength and stability to the lid 14 as wells as to the components carried by the primary case 20. Moreover, it provides an aesthetically pleasing look (i.e., forms a portion of the ornamental appearance of the computer 10).

In accordance with one embodiment, the primary case 20 may be formed as a single integral part. By integral, it is meant that the primary case 20 is a single complete unit. By being integrally formed, the primary case is structurally stronger than conventional housings, which include parts that are fastened together. Furthermore, unlike conventional housing parts that have seams between the parts, the primary case has a substantially seamless appearance. Moreover, this type of configuration helps prevent contamination and is more water resistant than conventional housings. In addition, by forming the primary case as a single integral part, the recyclability of device 10 and, in particular, primary case 20 may be improved relative to conventional housings. For example, because primary case 20 is formed from a single homogenous material such as aluminum without substantial use of adhesives, welds, or other metals, the primary case can easily be melted down as part of an aluminum recycling process. In essence, the primary housing 20 may be considered a precision unibody enclosure formed from a single piece of solid recyclable material (e.g., aluminum). As a result, it reduces many extraneous parts and allows the raw materials to be reused in other products.

Figure 1B:
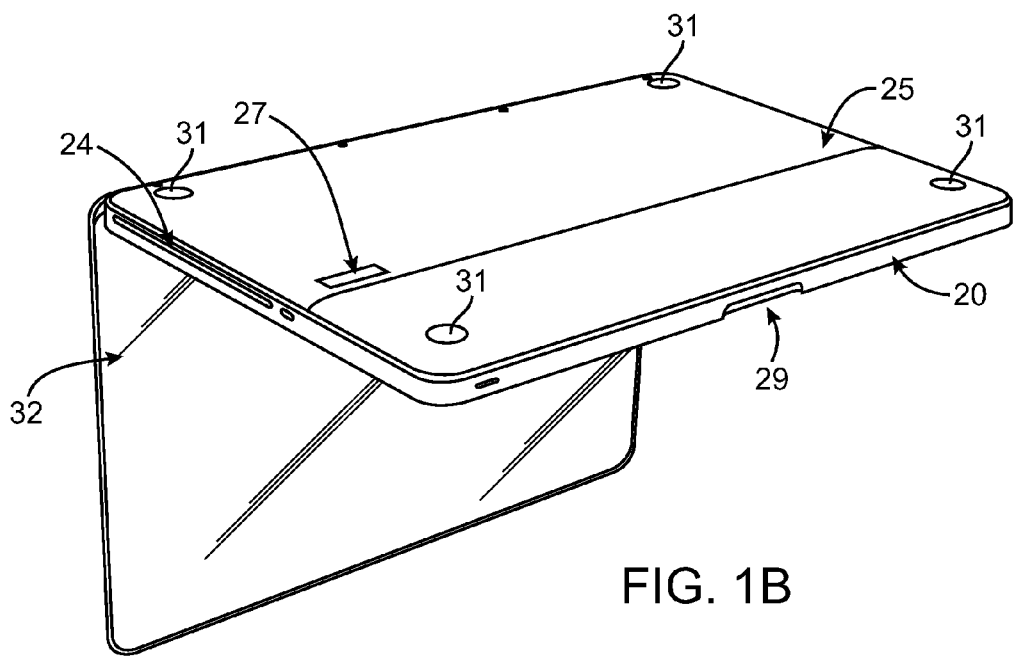

In one embodiment, the primary case 20 includes a horizontal planar top wall (surface) with integral and substantially vertical planar side walls (e.g., four integral side walls that are oriented perpendicular to the top housing wall as shown in FIGS. 1A and 1B). The top wall and side walls cooperate to define a cavity or void into which the various components of the base 12 may be mounted during assembly. The five walls are integrally formed as a single part. The top wall and side walls may be formed by machining a core of material (e.g., a slab of aluminum).

In one embodiment, the base does not include a separate frame assembly. Rather, the primary case 20 includes one or more integral frame members (e.g., ribs) that provide structural rigidity to the top case. That is, the frame members are homogenous with the rest of the primary case 20. This set up reduces the number of assembly steps as well as makes recycling the primary case much easier. As should be appreciated, frames in conventional components are often formed from disparate materials that are fastened or glued to the housing thereby making recycling much harder.

In one embodiment, the base eliminates some or all of separate attachment features used to secure the components within the base. Instead, the primary case 20 includes one or more integral attachment features. These may, for example, include tabs, slots, bridges, snaps, hooks, catches, flexures, ribs, standoffs, bosses, and the like. It should be appreciated however that some separate bracketing may be required to capture components such as a hard drive (which typically requires shock mounting) and an optical disk drive (which may include felt or other material to help prevent dust from entering the optical disk drive).

In one embodiment, it may be relatively easier to assemble of portable computer 20 than conventional portable computers. For example, because primary case 20 is formed from a single machined block and includes many of the attachment features used to secure components within the primary case, portable computer 20 may be assembled relatively quickly as components can be screwed directly into primary case 20 without the need to install separated attachment features (which typically require additional installation time).

In one embodiment, every surface of the primary case 20 is machined from a core of metal material such as aluminum. That is, every surface of the primary case 20 is machined (inside and out).

In one embodiment, the top case includes undercuts, recesses, protrusions, channels, and openings formed by machining operations. Undercuts may help form attachment features such as slots or channels underneath bridges. Recesses may help create component zones such as zones for placing a hard drive or an optical drive. Protrusions may help create ribs for support or attachment points for various components such as keyboards and main logic boards. Channels may provide passages for wires or flex circuits. Openings may provide access to various components such as keys, track pads, ports, slots, indicators, and the like.

It should be appreciated that conventional housings typically include stamped materials or that are glued or otherwise fastened together or alternatively plastic injected materials. In either case, the housing are further limited by the need for separate attachment features that are glued or otherwise fastened to the housings. This creates additional steps and a need for increased tolerance gap which encourages thicker devices thereby making them aesthetically unpleasing.

The integral top case described herein provides a more accurate structure, reduced tolerances, thinner, lighter and stronger enclosure. It eliminates the need for weld bonds, glue bonds which can be thicker, weaker and aesthetically unpleasing compared to integrally formed features (e.g., features that are homogenous with the top case).

Figure 2:
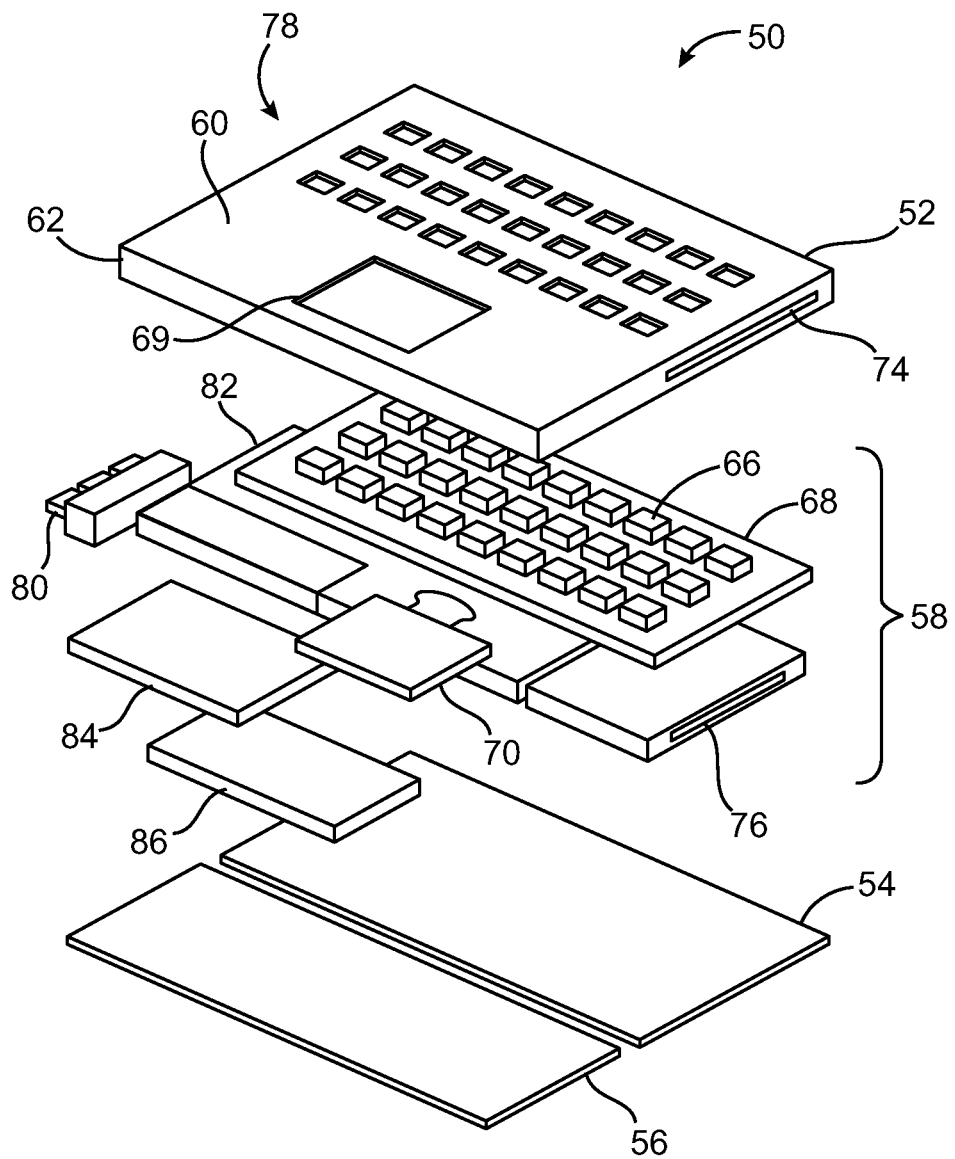
FIG. 2 is an exploded perspective view of an illustrative base of a portable computer that may have a unified top case in accordance with an embodiment of the present invention.

FIG. 2 is an exploded view of a base 50 of a portable computer, in accordance with one embodiment of the present invention. The base 50 may, for example, correspond to the base shown in FIG. 1. As shown, the base 50 includes a top case 52, bottom cover 54 and an access door 56 that cooperate to enclose a plurality of internal components 58. The top case 52 serves as the primary structure of the entire base and further entire portable computer. In one embodiment, the top case 52 is a single unified (e.g., homogenous) part that supports the internal components in their desired position within the base. That is, the internal components are mounted to and within the underside of the top case 52. Although not shown, the top case 52 includes a void into which the internal components are positioned. The void is defined by integral top wall 60 and integral side walls 62 (e.g., the four integral vertical planar side walls shown in FIG. 2) that surround the edge of the top wall 60.

As shown, the top wall 60 includes a first set of openings 64 for receiving individually and spaced apart keys 66 of a keyboard 68. The top wall 60 also includes a second opening 69 for receiving a touch pad assembly 70. The touch pad assembly 70 may include a platform that fits within the opening 69. The platform may be movable in order to provide a clicking action. It may, for example, be cantilevered relative to the top wall 60 at the backside of the opening 69. The side walls 62 may include an opening 74 which provides access to an optical drive 76. The side walls 62 may additionally include various openings 78 for access to ports 80. Although not shown, the underside may include recesses and attachment points for all the aforementioned components as well as main logic boards 82 and hard drive 84. The attachment points may provide a means for attaching such as snaps, clips, tabs, slots or alternatively they may provide threads for receiving screws.

Once the components are attached to the underside of the top case 52, the bottom cover 54 may be secured to the top case 52 thereby partially closing/covering the internal components carried by the top case 52. The side walls 62 may include a recess or flange that receives a mating edge of the bottom cover. Screws may be used. The open area still provided at the bottom may provide a docking area for a battery 86. The battery docking area may be closed off/covered by securing the access door 56 to the top case 52. A latching mechanism may be used to engage and disengage the access door from the top case.

The top case 52 also includes a cut out for a hinge portion and a lip for managing the opening of the lid when the top case is assembled in a portable computer such as the one previously described.

In one embodiment, the entire top case 52 is formed by machining a core of aluminum to the desired shape and size. This includes the walls, openings and attachment features. As a result, the top case is an integrally formed housing structure, i.e., one homogenous part. The core may, for example, be an extruded piece of aluminum with a near net shape that is similar to the desired size and shape of the top case. In this example, material may be removed from the core to produce a top surface and integrally formed side walls that define the void or cavity. The material may also be removed to create the various openings, slots, ribs, frames, holes and the like. As a result, the top case may be formed as a single integral and homogeneous piece.

Figure 3A:
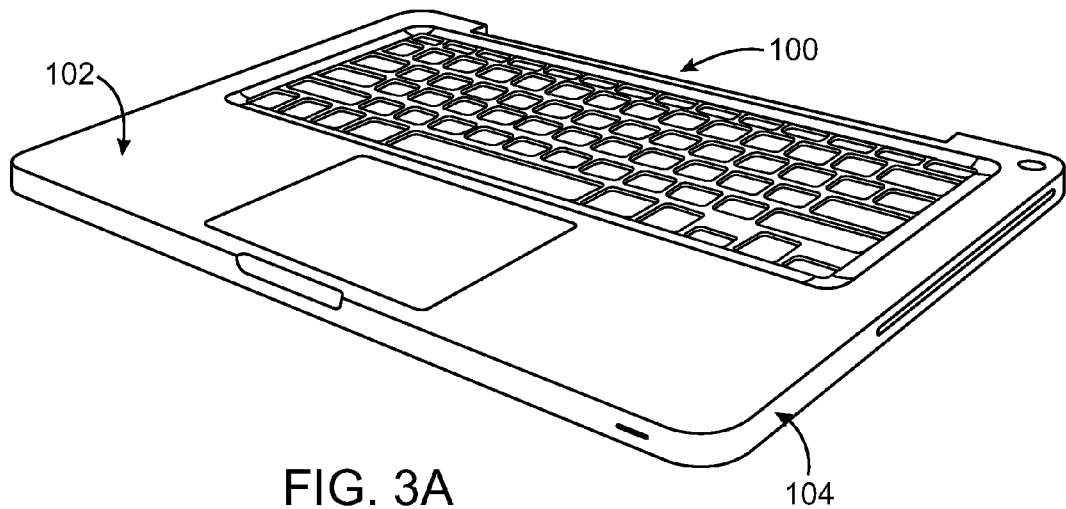
FIG. 3A is a top perspective view of an illustrative top case in accordance with an embodiment of the present invention.
Figure 3B:
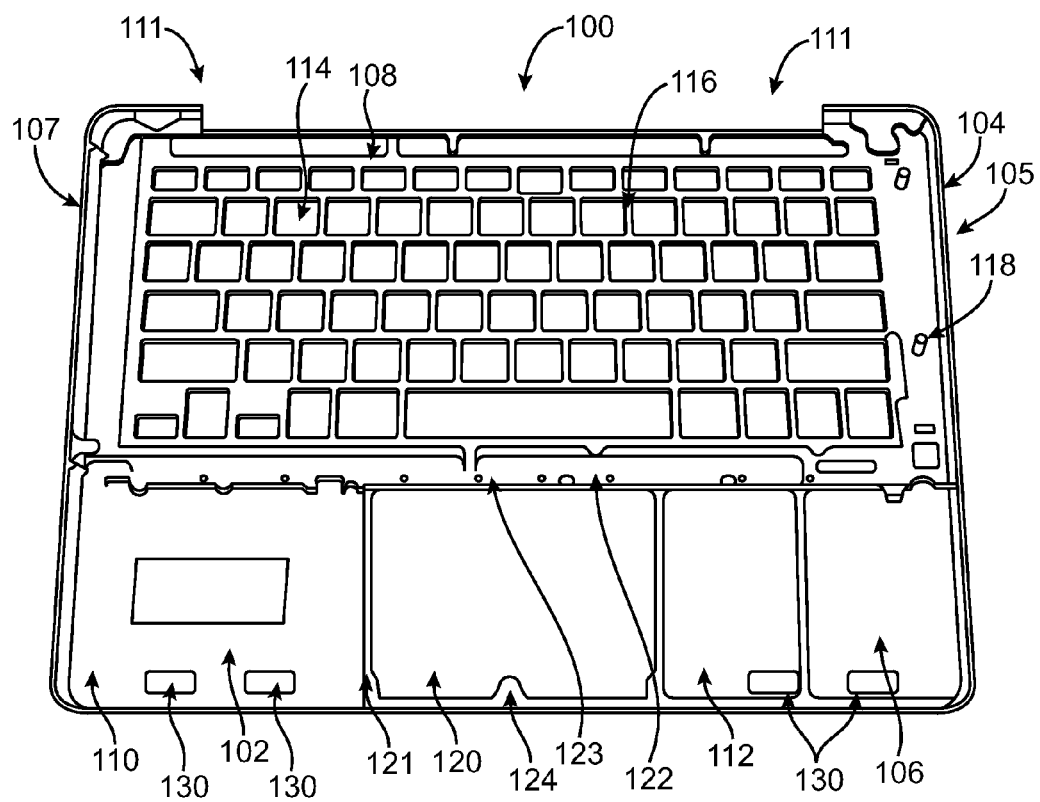
FIG. 3B is a bottom view of an illustrative top case in accordance with an embodiment of the present invention.

FIGS. 3A and 3B are top and bottom views, respectively, of a top case 100 of a base, in accordance with one embodiment of the present invention. The top case 100 may, for example, correspond to the top case shown in FIG. 2. The top case 100 is configured to serve as the outer enclosure, inner frame and cosmetic exterior of the base. In one embodiment, the top case 100 may be formed entirely from a single homogeneous piece of material. More particularly, it may be formed from a core of metal such as aluminum or similar material. In one embodiment, the top case 100 is formed by machining a single core of material.

As shown, the top case 100 includes a top wall 102 and side walls 104 extending from the edge of the top wall 102. Because they are formed from the same piece of material the walls are integral with one another. The top wall 102 and side walls 104 may define a cavity or void 106 for placement of components of the base. The top and side walls may also serve as attachment areas where the components are mounted.

As shown in FIG. 3B, the top case 100 has been machined to form various zones including for example a keyboard zone 108, track pad zone 109, hard drive zone 110, battery zone 112, connector/port zone 105, an optical drive slot zone 107, and a hinge zone 111.

The keyboard zone 108 includes a plurality of machined openings 114 into which independent keys of the keyboard are placed. The area around the openings creates a webbed structure 116. This area may include various features for attaching the keyboard. It may include standoff or bosses and may even include threads for receiving screws. This area may also include standoffs 118 for receiving other components that are laid over the keyboard during assembly. For example, the top wall may include standoffs for a main logic board (MLB) and an optical drive (ODD). All of these are integrally formed from the base material.

The track pad zone 109 includes a machined opening 120 and machined ribs 121 that surround the opening 120. The back side rib 122 may include a bridge 123 for receiving a tab of the track pad assembly such that it cantilevers within the opening 120. The rib 122 may extend across the length of the top wall to provide strength and rigidity. The opening 120 may also include a flange 124 that extends into the opening 120. The flange 124 is configured to support a switch which is activated when the track pad is pushed downward (e.g., clicking action).

The hard drive zone 110 may includes features such as undercut slots or voids that receive tabs or cutouts/protrusions on the hard drive.

The battery zone 112 may include several recesses 130 for placement of magnets that help to secure lid 14 (e.g., housing 15) to base 12 (e.g., housing 13) when lid 14 is in a closed position relative to base 12.

The connector zone 105 may include several openings in case 100 (e.g., housing 13) that allow external cables with connectors to couple to ports in case 100 with corresponding connectors. As an example, these may openings may include openings for Ethernet® connectors, USB® connectors, audio connectors, power connectors, and any other suitable connectors.

The optical drive zone 107 may include a single elongated opening in case 100 that allows optical media discs (e.g., compact discs or other optical media discs) to pass from outside case 100 to an optical drive inside case 100. The optical drive zone 107 may also include other openings such as a button opening. The button opening may allow a user to eject an optical media disc from computer 10.

The hinge zone 111 may include recessed in which hinge components are mounted and may include holes in which hinge components formed as part of lid 14 are recessed when lid 14 is coupled to case 100 (e.g., housing 13).

Although not specifically pointed out, it should be appreciated that many features can be produced including, for example, recesses of varying levels and wall thicknesses of various thickness. It should also be appreciated that points of stress may be machined to provide added strength so as to reduce flexibility and bending. It should also be appreciated that areas can be machined away to provide space for internal components such as flex circuits, printed circuit boards and the like.

Referring to FIGS. 3A and 3B, as mentioned, various outer shapes may be produced to affect the ornamental appearance of the device 10 when utilizing machining operations. In the illustrated embodiment, the top surface and side surfaces may be substantially flat. Furthermore the top surface and side surfaces may be substantially perpendicular thereby generating a sharp edge. Furthermore, the bottom edge of the walls may include a taper that substantially matches the taper of the cover and door that are mounted to the bottom of the top case to create a final assembly.

FIGS. 4A-4D are various views of machined integral features of a top case, in accordance with one embodiment of the present invention. The top case may, for example, correspond to the top case shown in FIGS. 3A and 3B.

Figure 4A:
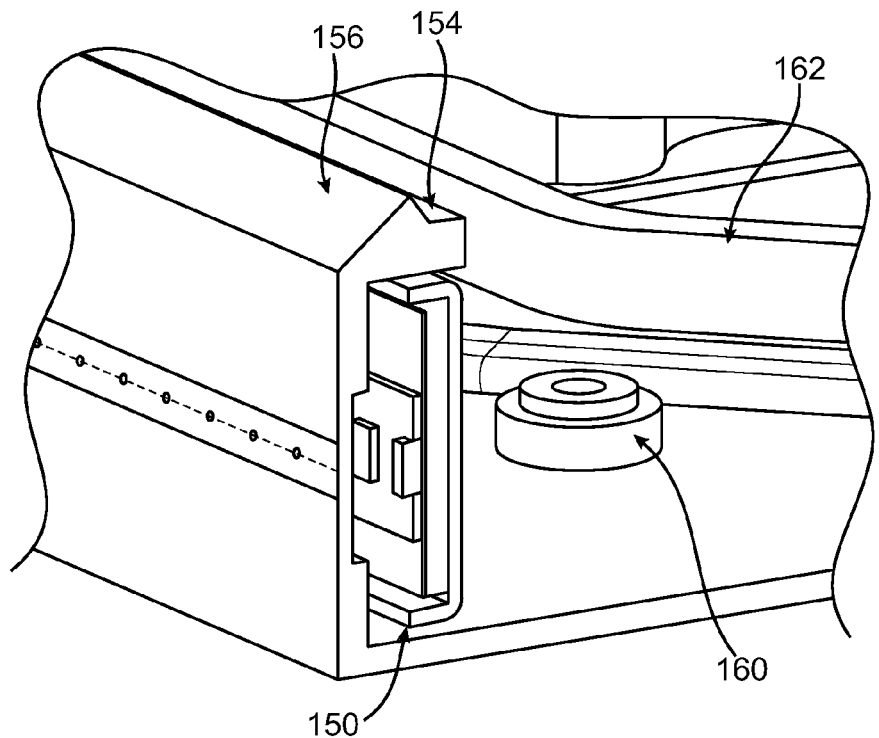
FIGS. 4A-4D are perspective views of an illustrative top case showing integral features of the top case in accordance with embodiments of the present invention.

As shown in FIG. 4A, the side wall of the top case includes an undercut area 150 for placement of a component such as a light indicator assembly. The flange portion 156 may include a recess 154 for receiving an edge of a bottom case or access door and a sloped section for aesthetics. The top case may also include a boss 160 for receiving a mounting screw and ribs 162 for separating internal components and/or increasing structure integrity.

Figure 4B:
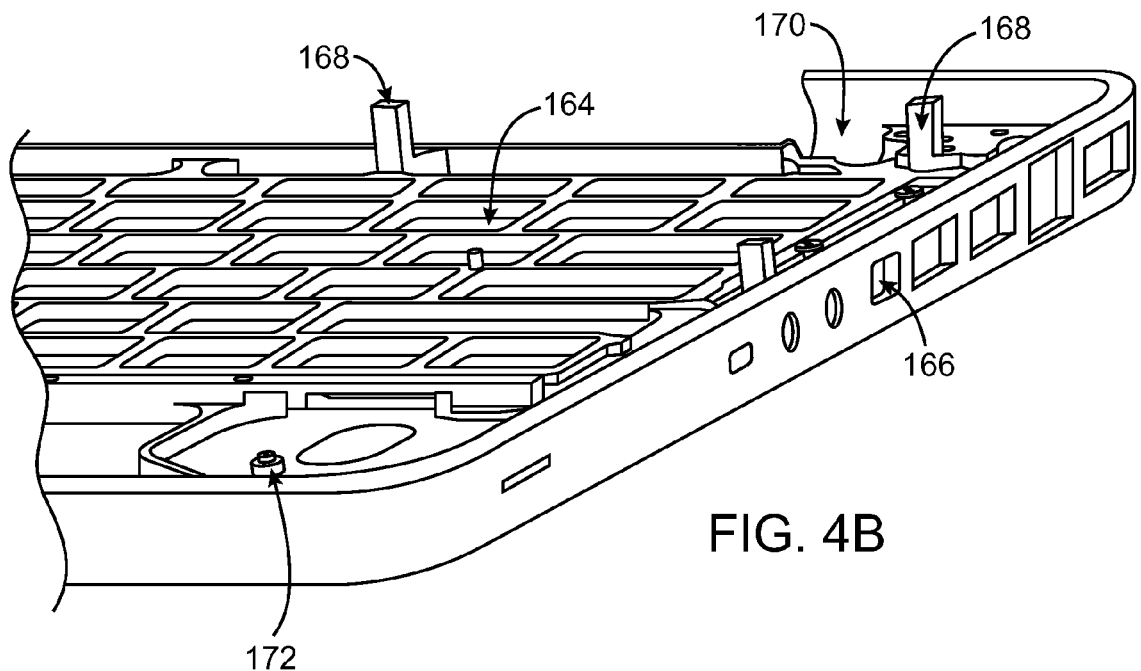

As shown in FIG. 4B, the top case may include openings 164 and 166. As an example, openings 164 may be openings for keys and openings 166 may be openings for connectors such as audio connectors, Ethernet® connectors, USB® connectors, security lock connectors, etc. The top case may also include stand offs 168 that help to prevent a bottom case or access door from impinging on the internal space within housing 13. The top case may also include under cuts 170 which can provide additional space for specific components (e.g., hinge components). The top case may include bosses 172 that provide attachment points to the top case (e.g., points which internal components, a bottom case, or an access door can be secured to the top case by screws).

Figure 4C:
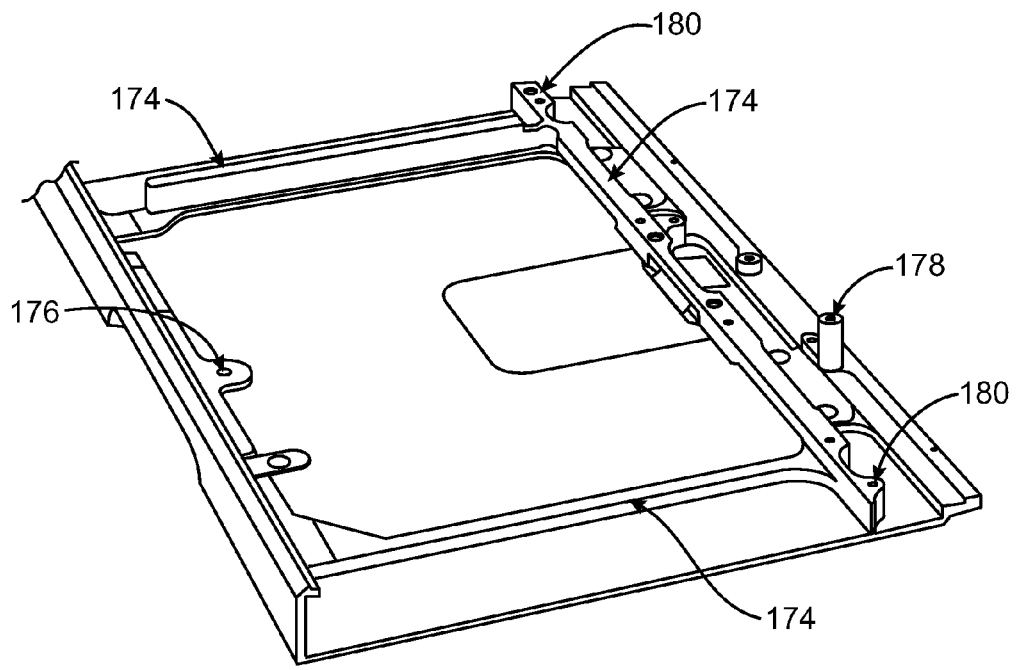

As shown in FIG. 4C, the top case may include ribs 174 and flanges 176. Ribs 174 may be used to enhance structural integrity and/or to divide the internal space in the top case (e.g., to separate internal components as desired). The top case may also include standoffs 178 that help to prevent a bottom case or access door from impinging on the internal space within housing 13 and threads 180 which can receive mounting screws (e.g., which can receive screws that hold internal components, a bottom case, or an access to the top case).

Figure 4D:
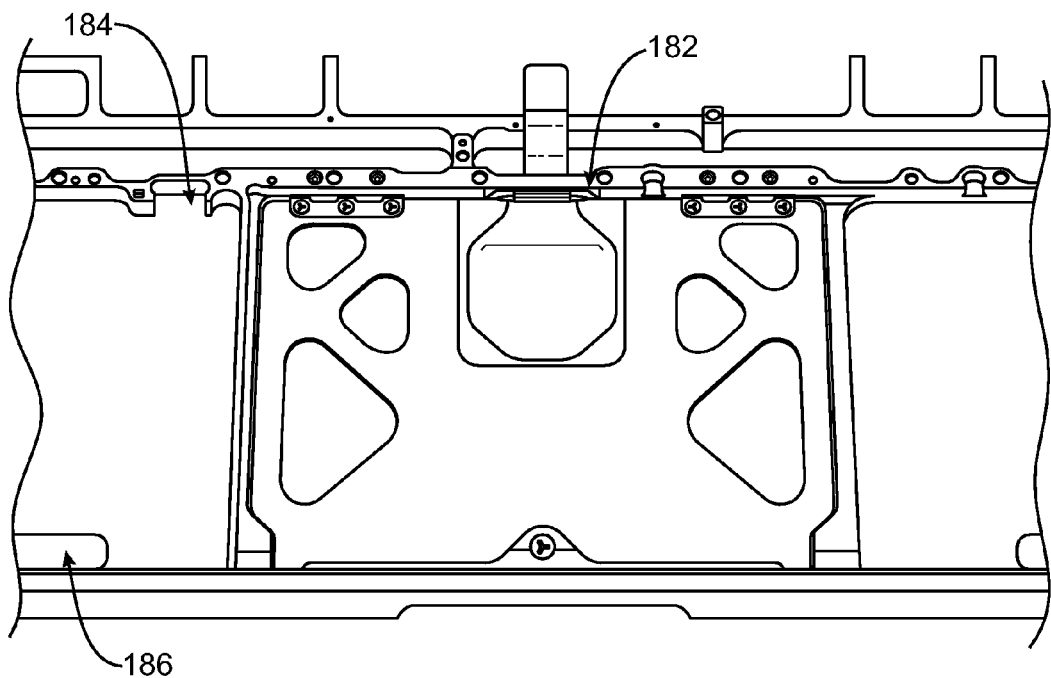

As shown in FIG. 4D, the top case may include a bridge 182, cut outs 184, and recesses 186. Bridge 182 may allow internal connections to pass beneath the bridge 182 in the space between bridge 182 and the top case. Cut outs 184 may be used to provide space for internal components and/or wiring. If desired, cut outs 184 may be used as mounting structures (e.g., internal components may have mounting structures that fit into cut outs 184 and align the internal components with the top case). Recess 186 may, as an example, hold magnets that are used to hold a battery in the top case.

FIGS. 5A-5K are various views of a portable computer, in accordance with one embodiment of the present invention. The portable computer may, for example, correspond and/or include any of the previous embodiments including, for example, the top case.

Figure 5A:
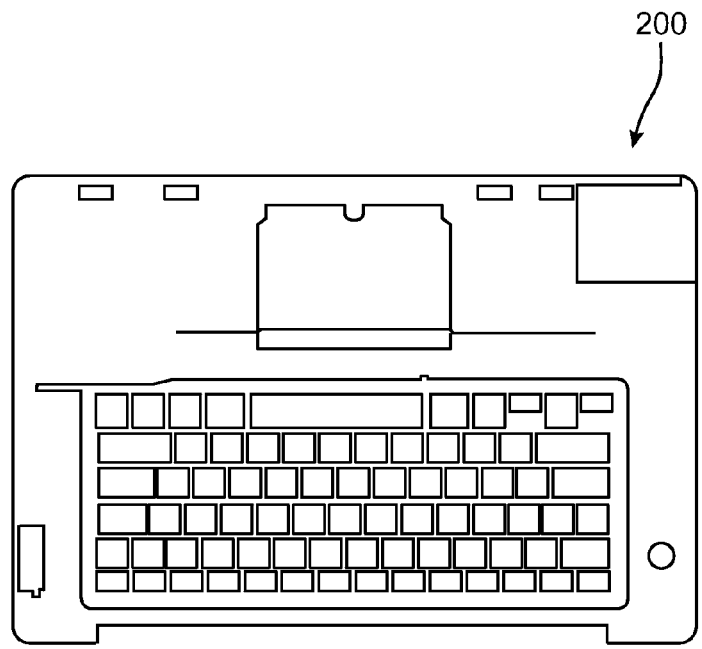
FIGS. 5A-5K are various views showing an assembly of an illustrative portable computer that may have a unified top case in accordance with an embodiment of the present invention.
Figure 5B:
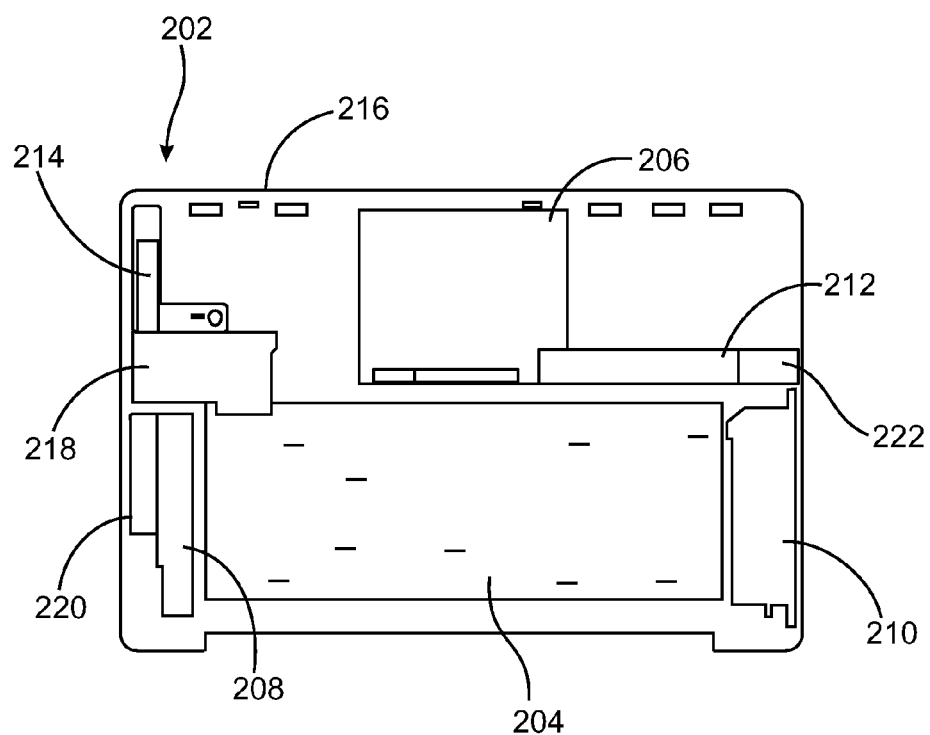
Figure 5C:
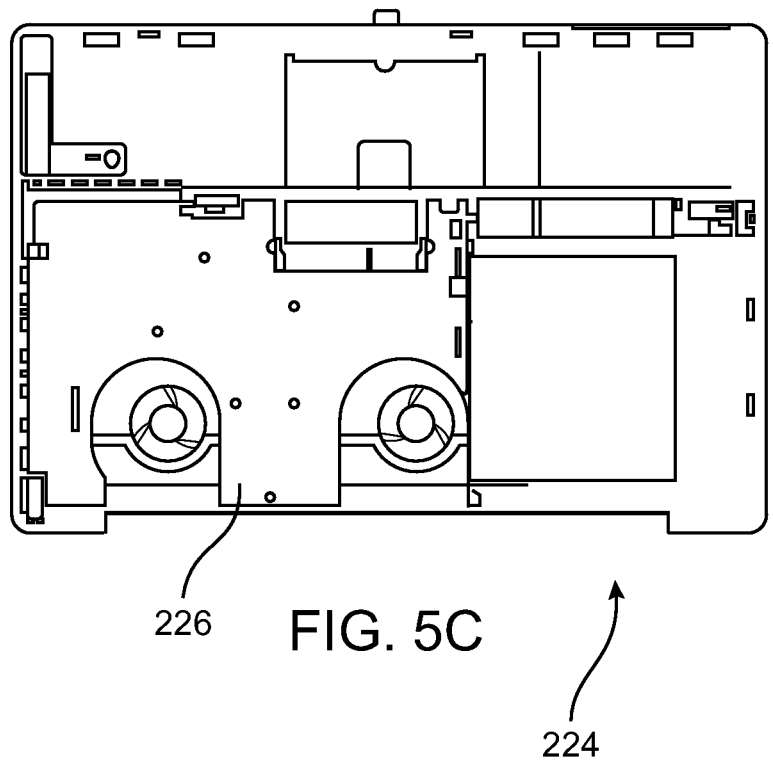
Figure 5D:
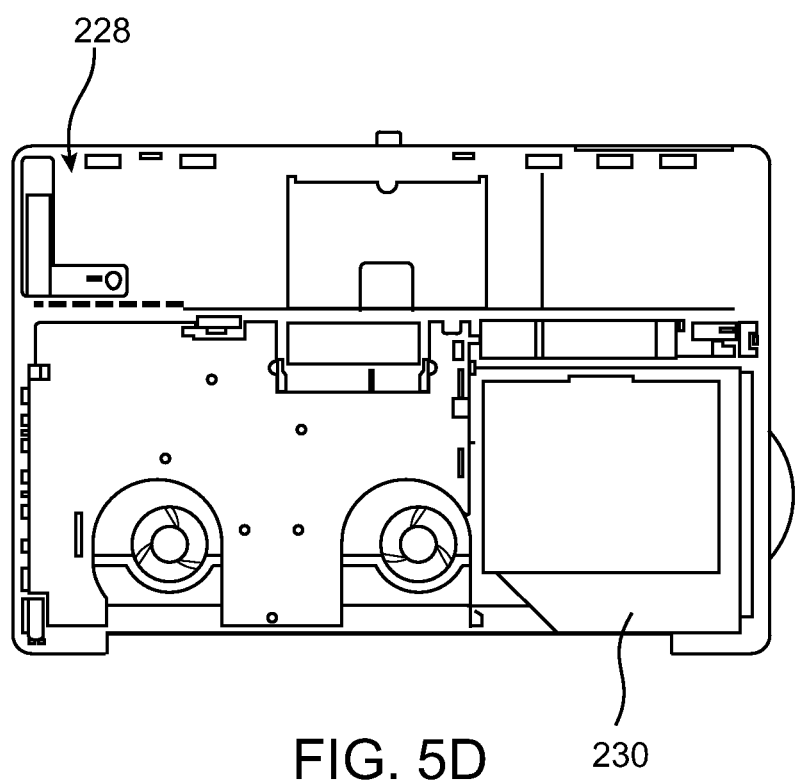
Figure 5E:
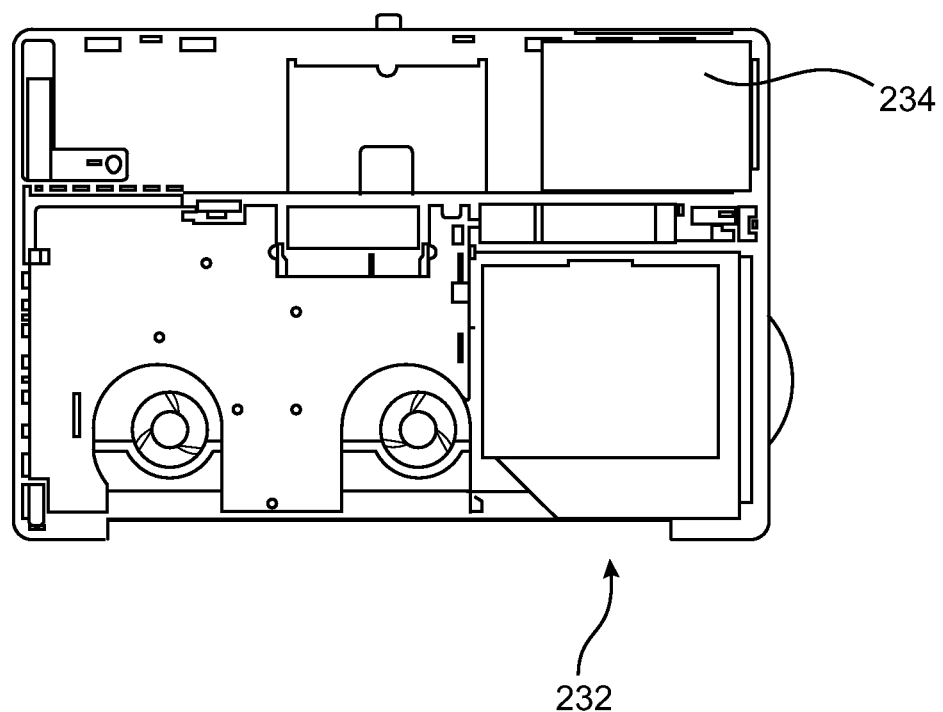

FIGS. 5A-5E show a sequence of images showing assembly of the portable computer, particularly various components of the portable computer to a top case. FIG. 5A shows providing a top case in step 200 (e.g., top case of FIGS. 3-4). FIG. 5B shows attaching keyboard 204 (with a fastener), track pad 206 (track pad 206 may include a button such as a pickbutton and may be attached with a fastener), speakers such as left speaker 208, right speaker 210 and subwoofer 212, battery connector 214, battery spring 216, a PC card cage such as PC card cage and fingers 218, main I/O shields 220, slider mechanism 222, etc. to the top case in step 202. FIG. 5C shows attaching a main logic board 226 (e.g., a MLB or motherboard) (partially overlays keyboard 204) to the top case in step 224. FIG. 5D shows attaching optical drive 230 (partially overlays keyboard 204) to the top case in step 228. FIG. 5E shows attaching hard drive 234 to the top case in step 232. These components may, for example, be attached to portable computer (e.g., to the top case) using fasteners such as screws. If desired, more sensitive components may be mounted using shock mounts (e.g., elastomeric and/or spring-based mounting structures).

Figure 5F:
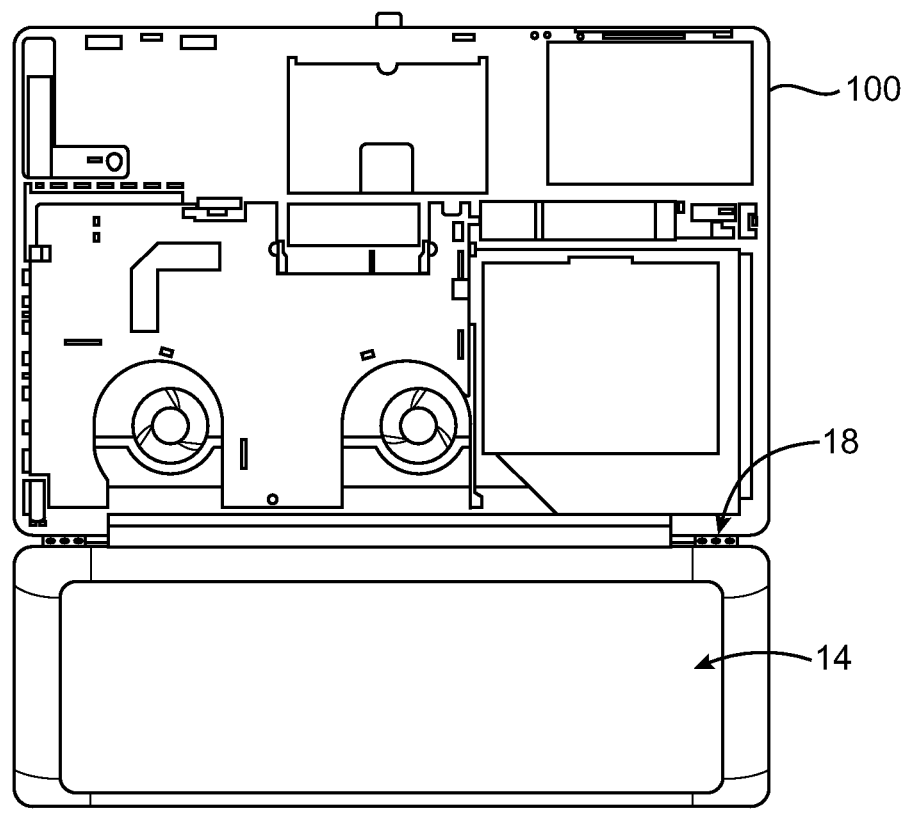

FIG. 5F shows attaching the lid 14 to the top case assembly 100 (e.g., the top case assembly shown in FIGS. 5A-5E). As shown, the lid 14 includes a hinge portion 18 that may be received by a cut out portion in the top case. The hinge may be screwed to the top case assembly 100 (e.g., by 6 screws).

Figure 5G:
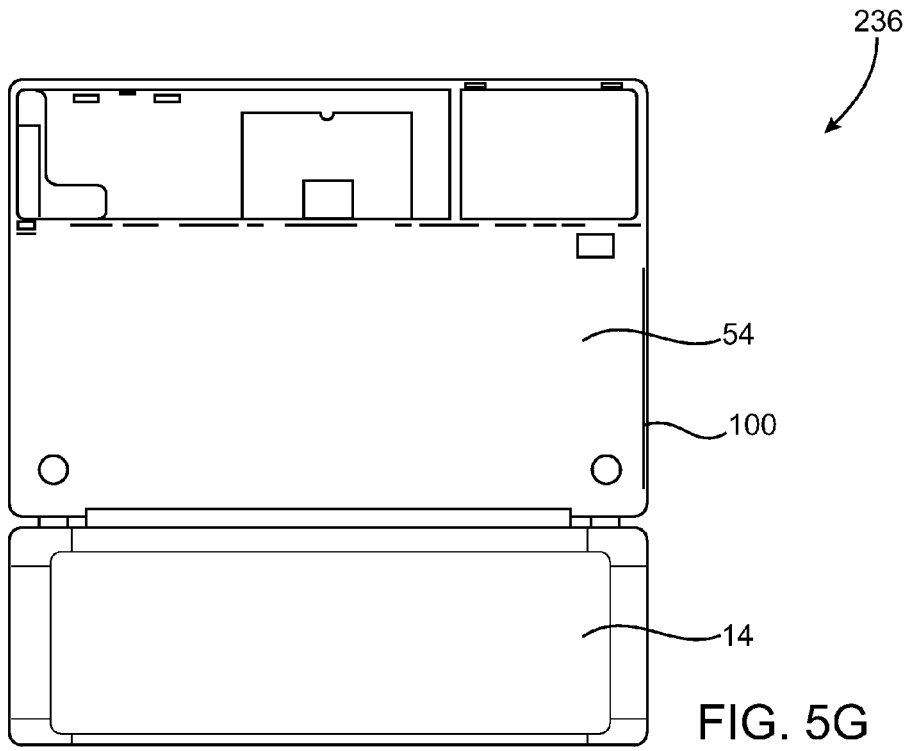
Figure 5H:
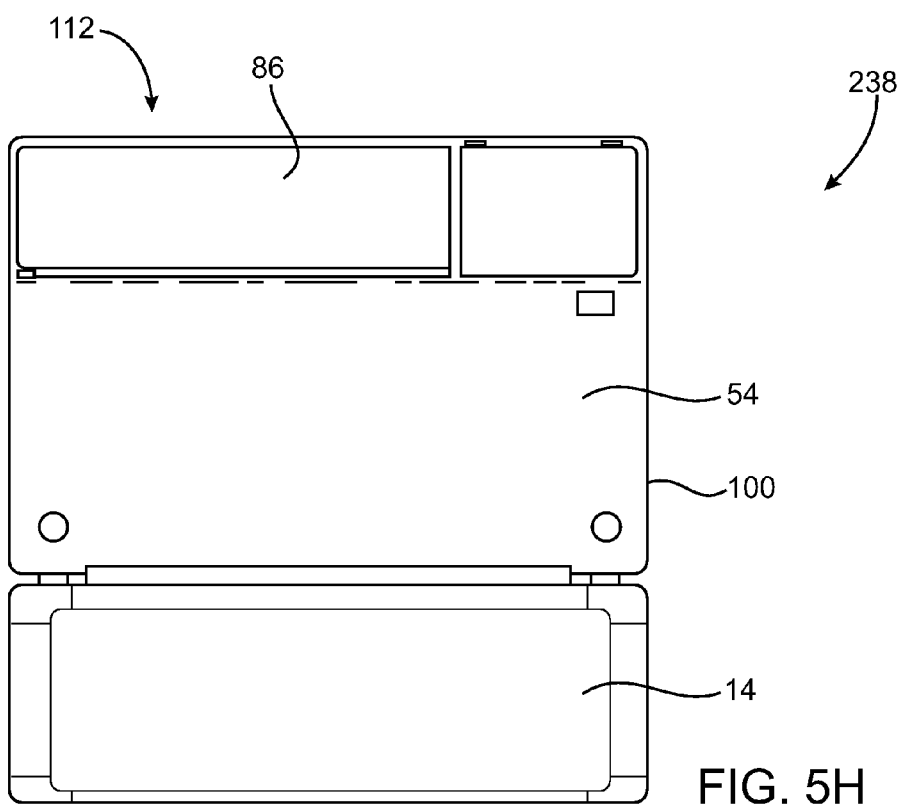
Figure 5I:
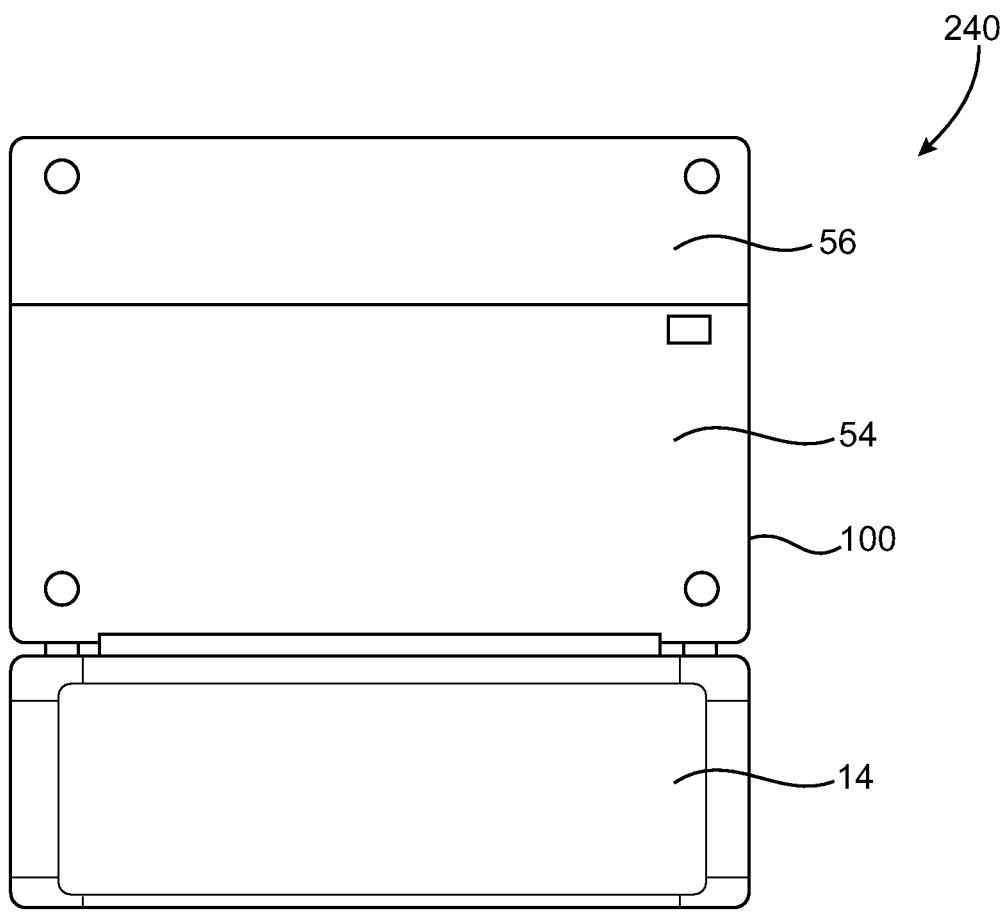

FIGS. 5G-5I show a sequence of images showing assembly of the portable computer. FIG. 5G shows attaching the bottom case 54 to the top case assembly 100 in step 236. FIG. 5H shows positioning the battery 86 within the battery dock area 112 of top case assembly 100 in step 238. FIG. 5I shows latching the access door 56 to the top case 100 in step 240.

Figure 5J:
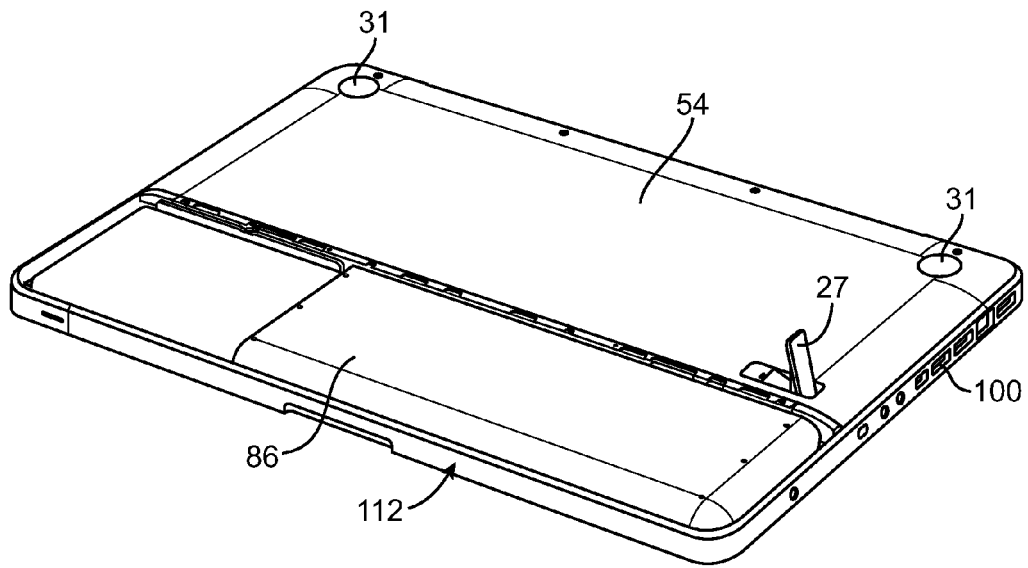

FIG. 5J shows 1) attaching the bottom case 54 to the top case 100 and 2) inserting the battery 86 into the dock area 112. The latching mechanism 27 is open and the access door 56 is removed.

Figure 5K:
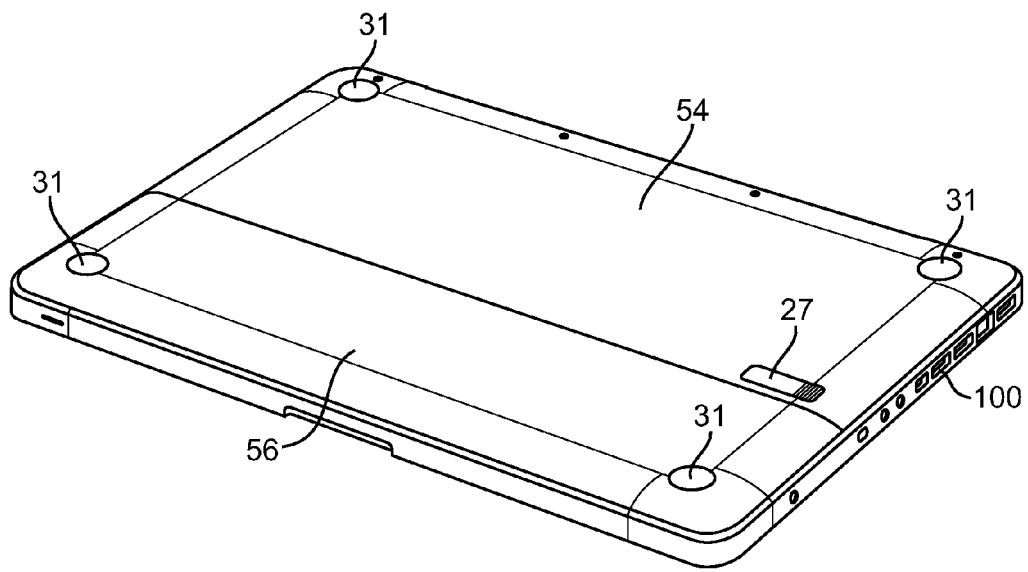

FIG. 5K shows 1) latching the access door 56 to the top case 100 and 2) closing the latching mechanism 27.

Figure 6:
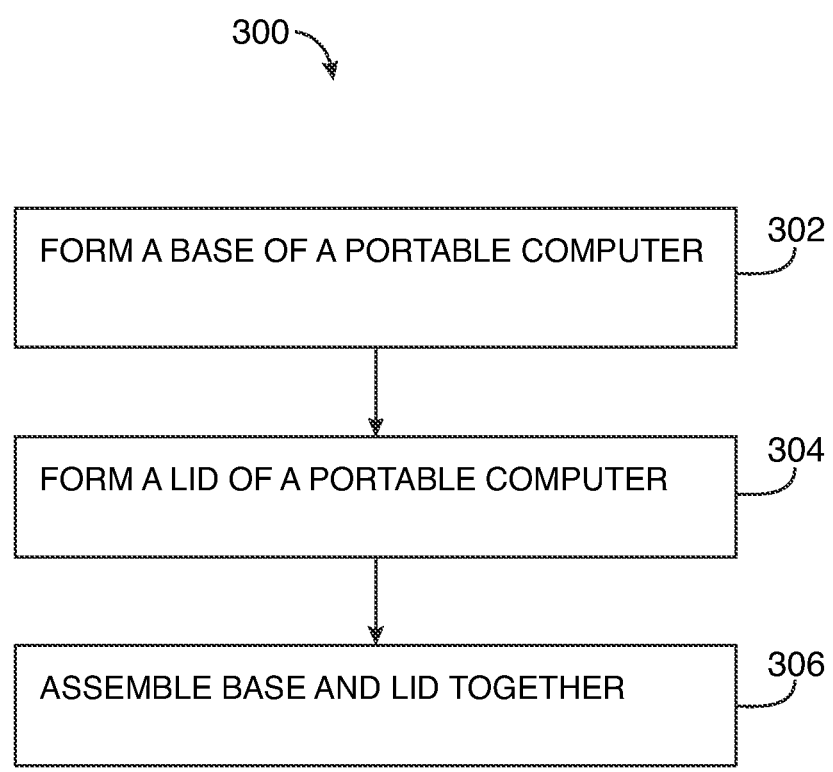
FIG. 6 is a flow chart of illustrative steps involved in forming and assembling a portable computer in accordance with an embodiment of the present invention.

FIG. 6 is a method 300 of assembling a portable computer, in accordance with one embodiment of the present invention. The portable computer may generally correspond to the portable computers and components shown in the previous figures. The method may, for example, correspond to the visual representation shown in FIGS. 5A-5K.

The method 300 may include block 302 where a base is formed. This may include forming a top case, integrating components into the top case and sealing the top case with one or more covers.

The method 300 may also include block 304 where a lid is formed. This may include forming a casing, and integrating components into the casing (or vice versa). For example, a casing may be attached to a display sub assembly that includes a display and hinge mechanism for attachment to the base.

The method 300 may also include block 306 where the base and lid are assembled together. For example, the lid and base are both mechanically and operatively coupled to one another. The base and lid may be coupled via a hinge system disposed therebetween. The hinge system allows the lid to move between an open and closed position relative to the base. The hinge system may also provide a means for operatively connecting the components of the lid to the components of the base. For example, it may provide an electrical connection between a display and a main logic board.

Figure 7:
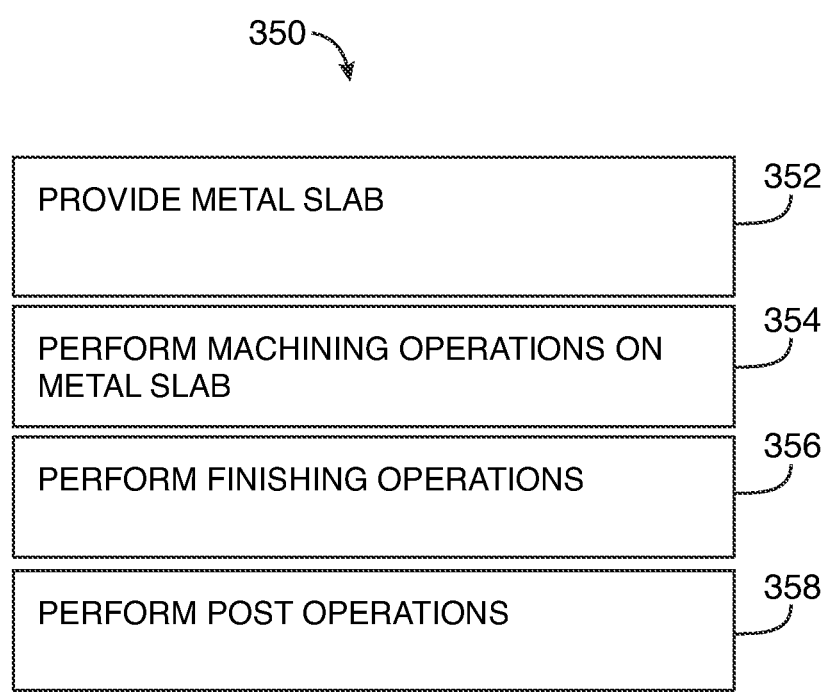
FIG. 7 is a flow chart of illustrative steps involved in forming a top case in accordance with an embodiment of the present invention.

FIG. 7 shows illustrative steps involved in a method 350 of forming a top case in accordance with one embodiment of the present invention. The method may, for example, be utilized in block 302 in FIG. 6. The method 350 may include block 352 where a metal slab (e.g., a metal core or a near net shape metal core) is provided. The metal slab may have outer dimensions that are near the desired dimensions of the top case. It may be slightly larger in X, Y and Z dimensions. In one embodiment, the metal slab is formed by extruding a metal in a long continuous length of material and segmenting the continuous length of material into a plurality of metal slabs. This may, for example, be accomplished by cutting the extruded metal at various points along its length. The metal slab may also include finishing operations to produce a flat surface. The flat surface may, for example, be the outer surface of the top wall of the top case. The flat surface may be used as a reference surface during subsequent operations. Other walls may also include finished surfaces.

The method may also include block 354 where machining operations are performed on the metal slab (e.g., the metal core or the near net shape metal core). The machining operations may be performed in a variety of steps including one or more rough machining steps and one or more fine machining steps. The rough machining steps are configured to remove a majority of the material out of the metal slab in order to produce a rough top case. By way of example, the rough machining operation may include coring the slab to produce a part with a top wall and side walls that form a cavity or void. In essence, the rough machining operation forms the general shape of the desired top case. The detailed machining steps are configured to provide the detail work that is responsible for the fit, finish and final precision of the part. The detailed machining steps may include forming openings in the walls such as key openings, port openings, speaker openings, slots, and track pad openings. The detailed machining steps may also include forming the final shape and dimensions of the part including for example wall thickness, and contours. The detailed machining steps may also include forming attachment areas for the various components of the base. The attachment areas may include recesses, slots, bridges, bosses, brackets, frame members and the like. Some of the attachment areas are extended lengths while others are discrete points.

The method 350 may also include block 356 where one or more finishing operations are performed. The finishing operations may include blasting. The finishing operations may also include grinding and/or polishing. In the case of aluminum, the finishing operations may include anodizing. The finishing operations may also include etching anodized areas so as to expose the metal underneath. These exposed areas may be used for EMI and/or grounding connection points. In one example, laser etching is used.

Thereafter, one or more post operations 358 may be performed including for example forming small perforations in the walls of the top case. The perforations may be used for speaker grills as well as indicator lights. The perforations may be macro or micro perforations depending on the needs of the portable computer. In addition, attachment points may be provided including for example threads for screws, etc.

Figure 8:
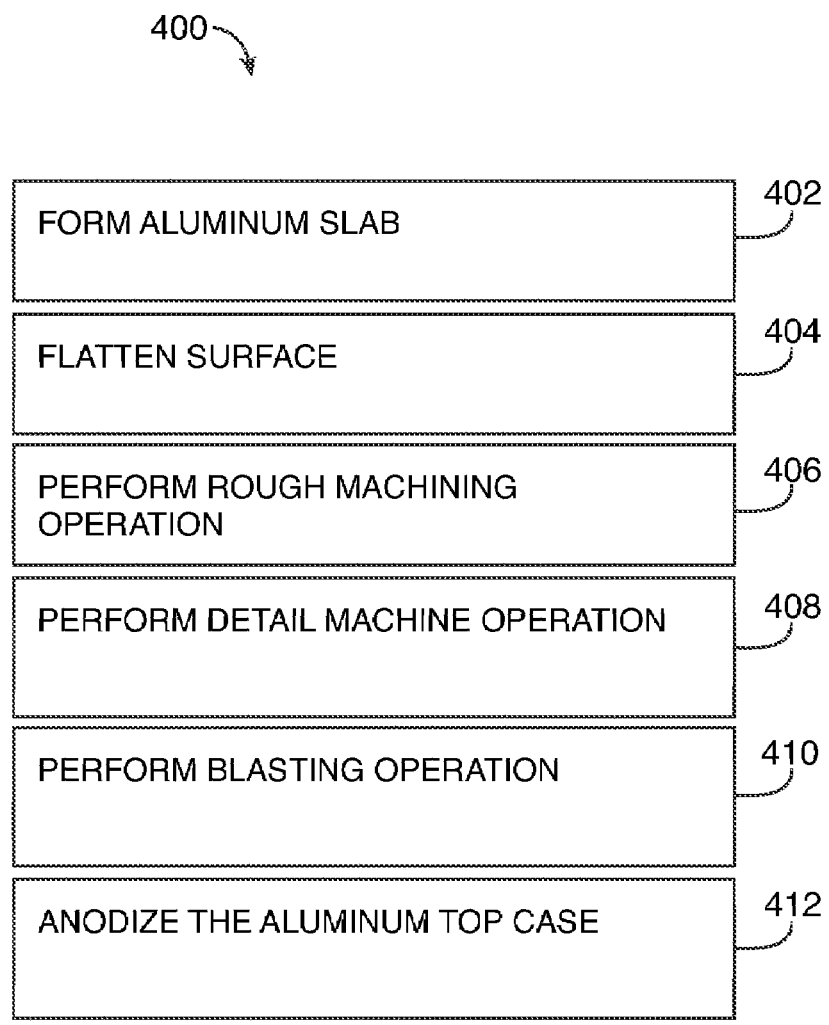
FIG. 8 is a flow chart of illustrative steps involved in forming a top case in accordance with an embodiment of the present invention.

FIG. 8 is a method 400 of forming a top case, in accordance with one embodiment of the present invention. The method includes block 402 where an aluminum slab (e.g., an aluminum core or a near-net shape aluminum core) or similar metal is formed by extrusion and segmenting the extrusion.

The method 400 also includes block 404 where at least one of the surfaces of the slab is flattened. The flattened surface provides a reference surface for future operations. The surfaces may, for example, be flattened using a fly cut machining operation. The metal slab is machined in order to provide flat surfaces.

The method 400 may also include block 406 where a rough machining operation is formed on the slab in order to create a near net shape of a top case. The rough machining operation may include forming a cavity in the slab such that a top wall and side walls are formed. The rough machining operation may, for example, be performed using computer numerical control (CNC) techniques. In some embodiments, the rough machining operation may be performed in one step. The rough shape of the casing is formed.

The method 400 may also include block 408 where one or more detail machining operations are performed. The detail machining operations may include machining the part to its desired shape and surface finish as well as machining in openings, frame members, channels and attachment areas/structures into the various walls including top wall and side walls that define the void. The detailed operations may be performed in a variety of CNC operations. Some operations may be dedicated to forming undercuts while others are dedicated to forming openings and/or recessed. In some embodiments between 5-12 detail machining operations are performed. These often occur in different CNC machines. During these operations, the fine shape of the casing is formed The method 400 also includes block 410 where the surfaces of the top case are blasted and thereafter in block 412 the aluminum top case is anodized. The method may additionally include block 414 where small perforations are formed through the walls of the top case. The small perforations may be associated with speakers, microphones, as well as indicator lights.

Figure 9:
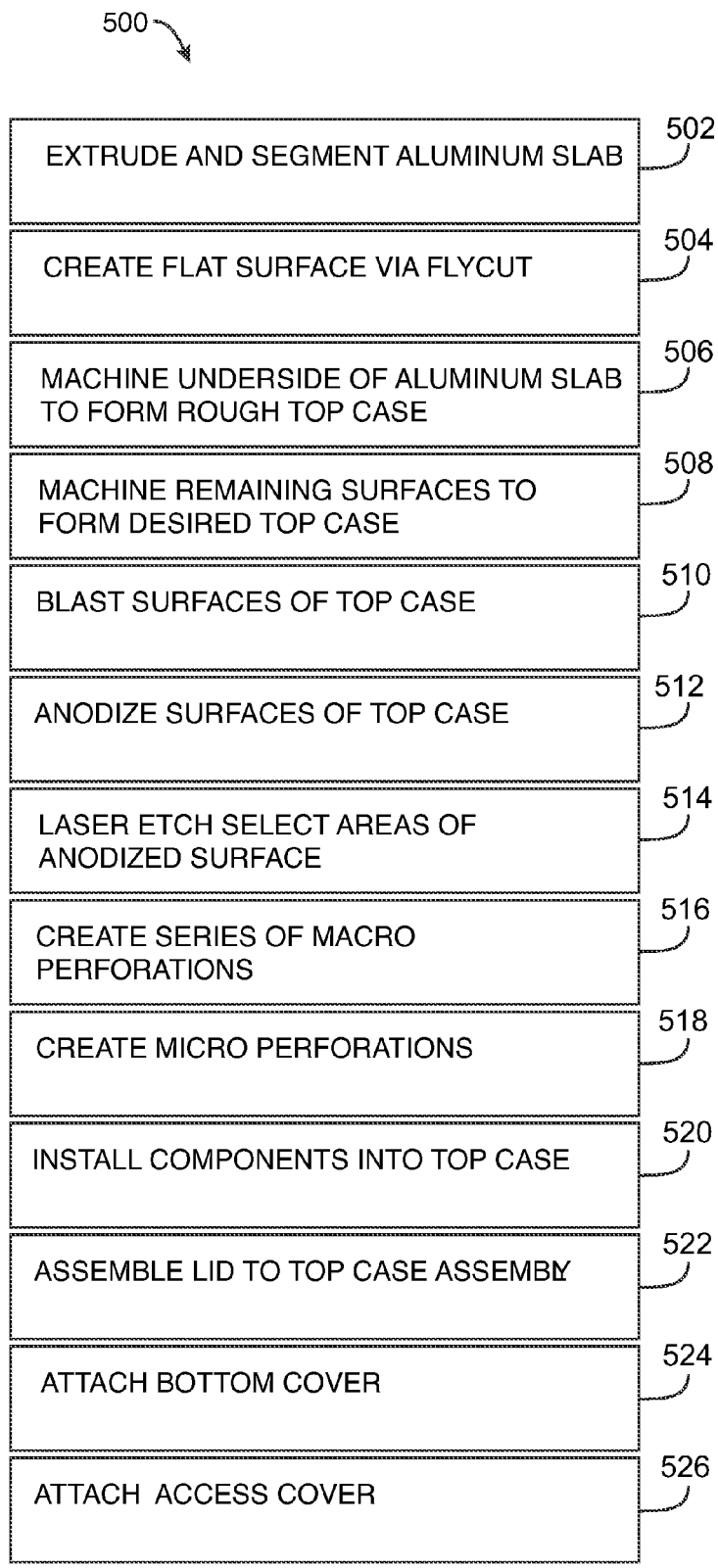
FIG. 9 is a flow chart of illustrative steps involved in forming a top case and involved in forming and assembling a portable computer from the top case in accordance with an embodiment of the present invention.

FIG. 9 is a method 500 of manufacturing a portable computer in accordance with a detailed embodiment of the present invention.

Method 500 may include block 502 where an aluminum slab (e.g., an aluminum core) is extruded and segmented. Extrusion is a process where material is pushed or drawn through a die to create the desired cross sectional shape. The process typically generates a continuous long length of product. Once extruded, the metal slab is typically separated from the continuous length of product (e.g., the metal slab is a segment of the extruded length).

Method 500 may include block 504 where a top surface of the slab is flycut in order to produce a flat surface.

Method 500 may include block 506 where the underside of the slab is machined to form a void which will receive the components therein. The void is typically defined by the top wall and side walls that surround the edge of the top wall. Although referred to as separate elements, it should be appreciated that the top wall and side walls are integral as they are formed from the same part. This makes the part more structurally sound. It also eliminates steps such as fastening. Conventionally, these elements are glued or otherwise fastened together (not an integral part). The slab may, for example, be machined using a rough CNC operation.

Method 500 also includes block 508 where the remaining surfaces of the part are machined. This block includes forming internal features within the void. These internal features include forming channels for placement of wires and cables, snaps/clips for securing components, slots for receiving tabs of components. Block 508 may be performed in a series of detailed CNC machining operations.

Method 500 may also include block 510 where the part is blasted. The blasting operation may be performed to create a rough (matte) but uniform finish. By way of example, the blasting operation may use silicone carbide or other suitable materials as a medium.

Method 500 may also include block 512 where the part is anodized.

Method 500 may also include block 514 where select areas of the anodized surface are laser etched in order to form exposed aluminum areas.

Method 500 may also include block 516 where a series of perforations are formed in the top wall in order to form an integrated speaker grill. This may, for example, be accomplished using laser drilling.

The method 500 may also include block 518 where various microperforations are formed in the side walls of the top case. The microperforations may be used for indicator lights. Microperforations are not visible at the surface until light is provided therethrough. If desired, the perforations formed in steps 516 and 518 may formed after anodizing the top case 20. By forming the perforations of steps 516 and 518 after anodizing the top case, the visual appearance of the perforations may be improved. For example, the anodizing process may alter the visual appearance of perforations that are formed prior to the anodizing process by either altering the size of the perforations (which could possibly completely close the openings created by the perforations) or by giving the perforations a sparkling appearance (which may or may not be desirable).

The method 500 also includes block 520 where various components are installed to the top case. This is generally accomplished using a layered approach. That is, the components may layer or stack on top of one another within the void of the top case. By way of example, the keyboard may be positioned relative to the key openings in the top wall ad the keyboard may be screwed into the top wall using a plurality of screws. The screws may be strategically placed about the keyboard. The screws may be threaded into the webbed structure that defines the openings around the keys in addition to the area around the webbed structure. Furthermore, the main logic board (MLB), optical disk drive (ODD), hard disk drive (HDD) and thermals in addition to other components may be secured.

The method 500 also includes block 522 where the lid is assembled to the top case assembly. For example, it is mechanically coupled via a hinged clutch mechanism and operatively coupled through one or more flex circuits or wires that pass through the clutch mechanism.

The method 500 also includes block 524 where attaching a bottom cover to the top case over the void. The cover may partially cover the void in order to form a battery docking area.

The method 500 also includes block 526 where an access cover (e.g., door) is secured over the battery docking area such that the internal components are fully enclosed within the top case, bottom cover and the access cover.

Throughout the process, the method 500 may include cleaning and inspection processes. The inspection may include micro photography as well as dimensional analysis. Testing may include testing the various components as they are installed into the housing.

Figure 10:
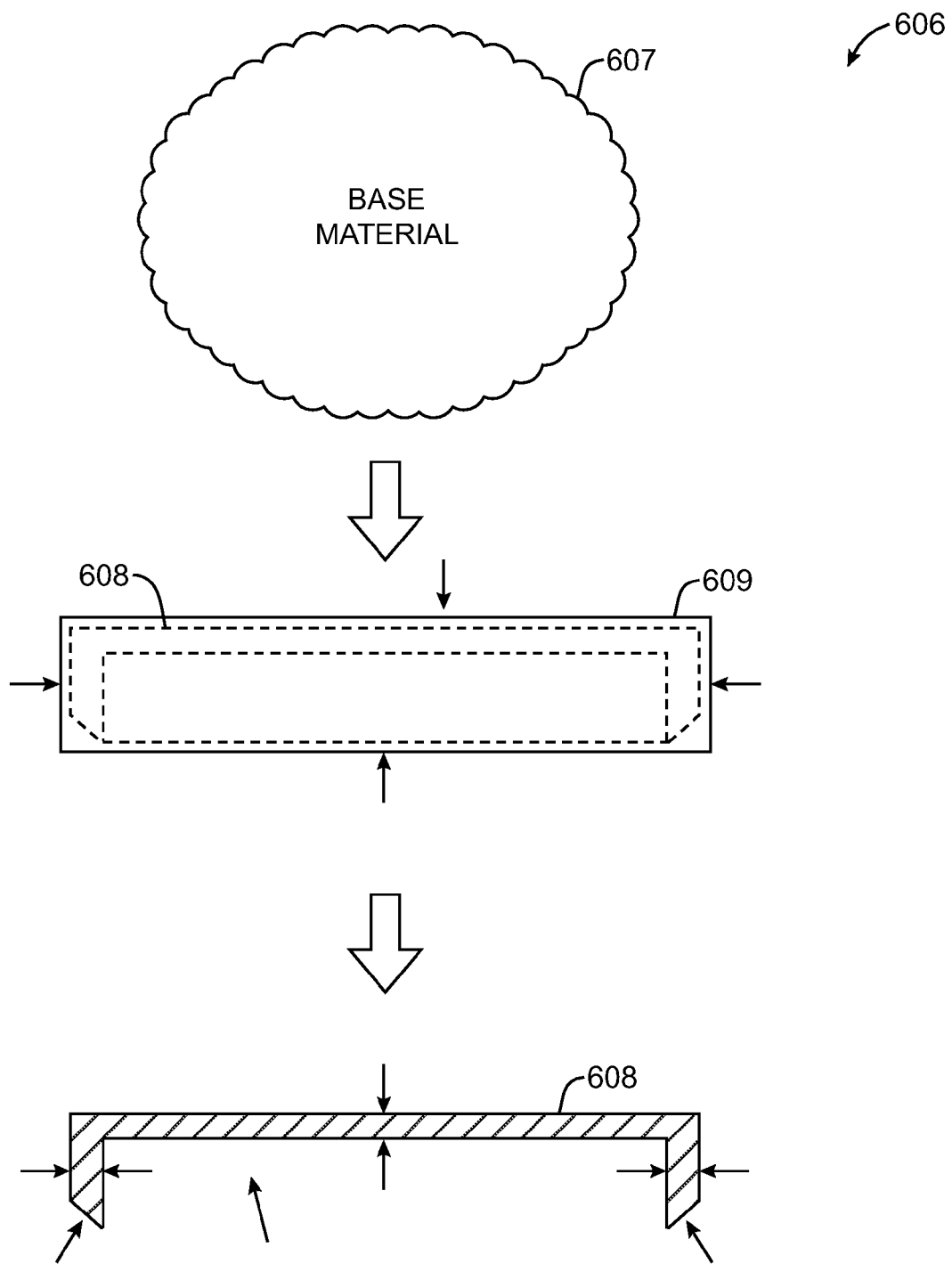
FIG. 10 is a diagram of illustrative steps involved in forming a top case in accordance with an embodiment of the present invention.

FIG. 10 is a simplified diagram of a method 606 used to create a metal housing member 608, in accordance with one embodiment of the present invention. The metal housing member 608 may be used in an electronic product such as a computer, and more particularly portable electronic devices such as portable computers. The metal housing member 608 may be configured to be the primary structural and cosmetic part of the electronic device. In fact, the metal housing member 608 may act as an exoskeleton that provides a base for carrying/supporting most if not all of the electronics, circuitry and other operational components of the electronic device, an enclosure for surrounding/protecting these components, and an ornamental/cosmetic feature of the electronic device. The metal housing member 608 may be a single unified homogeneous part (e.g., a unified top case). That is, it is not put together by fasteners, welds, glues and the like. As a result, the metal housing member 608 may be relatively easy to recycle (e.g., because there are not addition fasteners, welds, glues, or non-homogenous materials that need to be separated from member 608 before recycling). In one particular embodiment, the metal housing member is formed from aluminum or other similar metal.

As shown, the method 606 starts with a base material 607 that is turned into a metal core 609 (e.g., a metal slab, a metal core, an aluminum slab, an aluminum core, a metal billet, an aluminum billet, etc.). In one example, the core is formed via an extrusion process that produces a uniform and continuous length of a desired shape, which is cut to form a block having dimensions larger than the outer dimensions of the metal housing member being cut therefrom. In some cases, the dimensions are only slightly larger. As shown by the dotted lines, the metal housing member 608 is a 3D object disposed inside the block. As shown by the dotted lines, the metal housing member may include a top wall with integral side walls. It should be appreciated that although not shown in FIG. 10, the integral side walls may include four side walls that extend from the top wall. The top wall and side walls may, for example, define a cavity for placement of the internal electronic components. In one embodiment, the metal housing member is a primary structure of the main enclosure of the electronic device. In the context of a portable computer, for example, the metal housing member may be a top case. The metal housing member may serve as a platform for attaching the internal electronic components. For example, the electronics may be attached to the inner surfaces of the top and side walls.

In order to obtain the object or the final shape, the unwanted material is selectively removed away from the block. In essence, the block is being carved away to produce a sculpture in the form of a housing member. It is a subtractive method rather than an additive method. This may, for example, be accomplished with one or more machining operations.

Machining operations may be used to form walls, create openings in the walls so that electronic components can be accessed, create structural features such as ribs that strengthen the housing member, create internal attachment features for securing and correctly placing electronic components, form a cosmetic exterior, etc. The machining operations may include both rough and fine machining operations. In one example, the machining operations are performed via a CNC machine.

In one embodiment, a majority of the surfaces of the metal housing member have been cut or carved. As such, the desired shape and dimensional accuracy can be easily achieved. In another implementation, all of the outer surfaces of the metal housing member are cut or carved away (e.g., machined). Additionally or alternatively, a portion of the inner surfaces of the metal housing member may be cut away. As should be appreciated, the innards typically are not cosmetic and can thus be left alone (e.g., not cut or carved away) if the original metal core shape allows for this. More particularly, however, a majority of the inner surfaces may be cut away and, even more particularly, all of the inner surfaces may be cut away. In one particular embodiment, all of the surfaces are machined (as shown by the arrows in FIG. 10).

Figure 11:
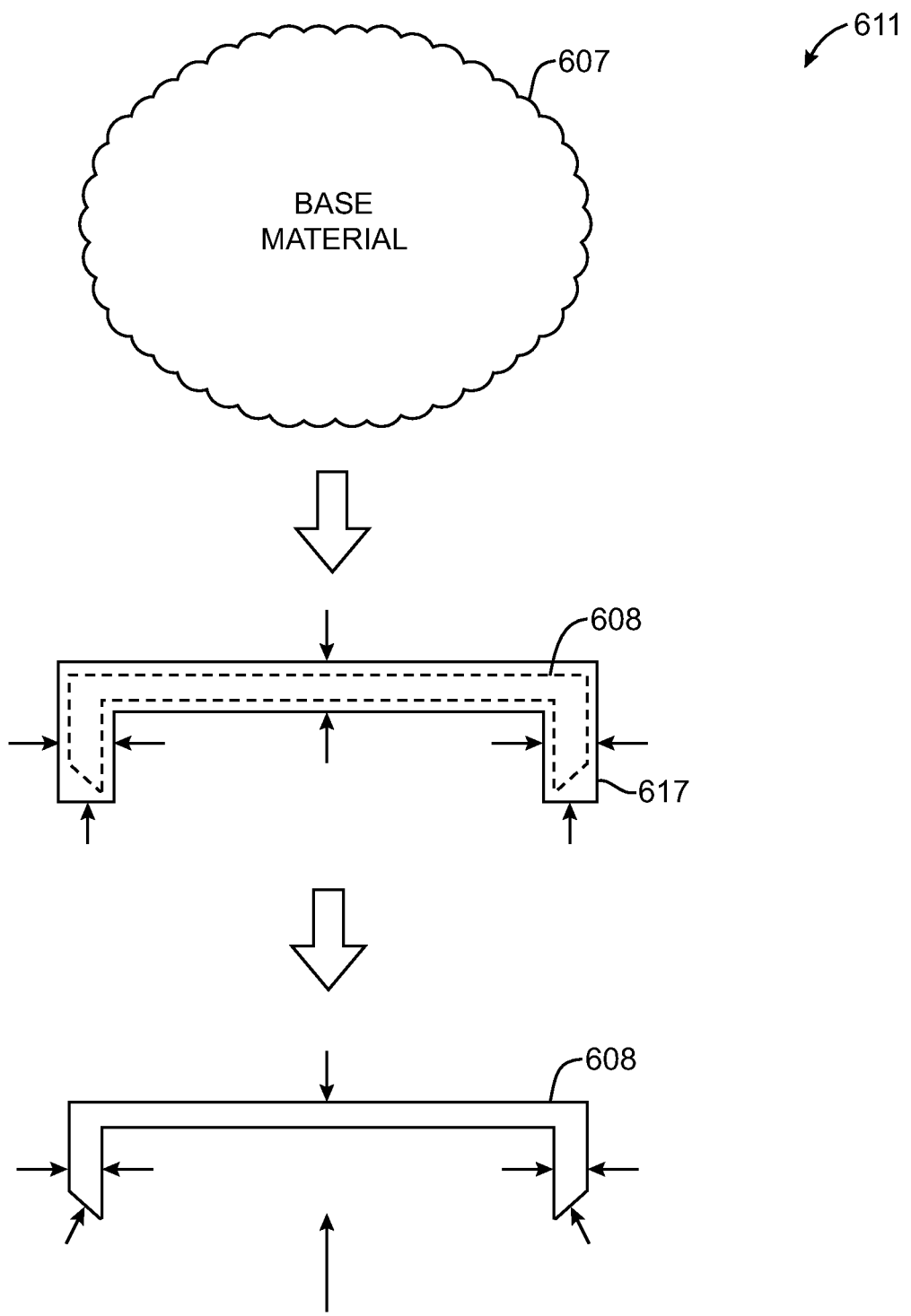
FIG. 11 is a diagram of illustrative steps involved in forming a top case in accordance with an embodiment of the present invention.

FIG. 11 is a simplified diagram of a method 611 used to create a metal housing member 608, in accordance with an embodiment of the present invention. FIG. 11 is similar to FIG. 10 in that the metal housing member is carved or sculpted from a metal block. However, instead using a metal core 609 that is shaped like a block, method 611 may use a metal core 617 that generally follows the shape of the final desired form of the metal housing 608. For example, the metal core may be formed to have a similar shape with slightly increased dimensions such that the desired shape can be formed by removing a layer of material from the surface of the metal core. By way of example, the metal core may generally have a top surface, and side walls that form a cavity therein. This metal core may, for example, be formed via a casting, a rough forging, a forging, a stamping, an investment casting, an extrusion process, or any other suitable technique.

FIGS. 10 and 11 may, in general, correspond to any of the methods and systems and components mentioned previously in FIGS. 1-9.

The foregoing is merely illustrative of the principles of this invention and various modifications can be made by those skilled in the art without departing from the scope and spirit of the invention.

What is claimed is:

1. An enclosure for a portable computer, comprising:
   an integral primary enclosure configured as a single finished homogeneous part formed by removing preselected portions of material from a single slab of extruded aluminum, the integral primary enclosure arranged to enclose components of the portable computer, the integral primary enclosure comprising:
      an integral top wall and side walls that cooperate to form a cavity, the cavity being defined by the top wall and the integral side walls, the top wall having a substantially planar outside surface, and
      a plurality of integral features extending from at least one of the plurality of walls defining the cavity and into the cavity, at least one of which is a structural rib extending from the integral top wall and into the cavity.

2. The enclosure as recited in claim 1, wherein the structural rib extends across less than an entire length of the integral top wall.

3. The enclosure as recited in claim 2, wherein the structural rib comprises:
   an attachment point comprising a threaded aperture extending into the structural rib.

4. The enclosure as recited in claim 2, wherein the structural rib comprises at least one cut out configured to assist in alignment of at least one component of the portable computer.

5. The enclosure as recited in claim 2, wherein the structural rib include an aperture machined through a bottom portion of the structural rib and configured to allow an internal connection to pass between the structural rib and the integral top wall.

6. The enclosure as recited in claim 1, wherein one of the integral features is a boss configured to capture a fastener within a threaded opening, and wherein the boss is configured such that the portion of the fastener captured within the boss is disposed entirely within a portion of the boss protruding from one of the walls of the integral primary enclosure.

7. The enclosure as recited in claim 1, wherein at least one of the integral features extends from the top wall a distance of at least half a height of one of the side walls of the integral primary enclosure.

8. The enclosure as recited in claim 1, further comprising:
   a bottom case secured to the integral primary enclosure by at least one fastener coupled with one of the integral features of the primary enclosure, the integral feature comprising a boss configured to retain a threaded end of the fastener.

9. The enclosure as recited in claim 1, wherein the integral primary enclosure is anodized.

10. The enclosure as recited in claim 1, wherein at least one of the side walls has an undercut geometry, the undercut geometry providing an undercut area for placement of a component of the portable computer.

11. A housing for a portable computer, comprising:
    a top case configured as a single finished homogeneous part formed by removing a volume of material from a single block of extruded aluminum, the top case arranged to enclose components of the portable computer, the top case comprising:
       a top wall and side walls that cooperate to form a cavity, the cavity being defined by the top wall and the side walls, the top wall having a substantially planar outside surface, and
       a plurality of integral features extending from at least one of the plurality of walls defining the cavity and into the cavity, at least one of which is an attachment feature extending from the top wall and configured to secure a subassembly within the cavity,
    wherein the volume of material removed from the single block of extruded aluminum is greater than a volume of the cavity defined by the top wall and sidewalls.

12. The housing as recited in claim 11, wherein the attachment feature comprises a boss configured to capture a portion of a fastener within a threaded opening, and wherein the boss is configured such that the portion of the fastener captured within the boss is disposed entirely within a portion of the boss protruding from the top wall of the top case.

13. The housing as recited in claim 12, wherein the subassembly is selected from the group consisting of keyboards, touchpads, and printed circuit boards.

14. The housing as recited in claim 11, wherein the plurality of integral features further comprises a structural rib extending from the top wall of the top case.

15. The housing as recited in claim 14, wherein the structural rib includes a threaded aperture extending into a top surface of the structural rib, the threaded aperture configured to receive a fastener for securing an electronic component within the top case.

16. A housing for a portable computer, comprising:
a top case configured as a single finished homogeneous part formed by removing a quantity of material from a single block of metal, the top case arranged to enclose components of the portable computer, the top case comprising:
- a top wall and side walls that cooperate to form a cavity, the cavity being defined by the top wall, and the side walls, the top wall having a substantially planar outside surface, and
- a plurality of integral features extending from at least one of the plurality of walls defining the cavity and into the cavity, at least one of which is a boss configured to capture a fastener within a threaded opening, wherein the quantity of material removed from the single block of metal corresponds to a volume of material greater than a volume of the cavity defined by the top wall and sidewalls.

17. The housing as recited in claim 16, wherein the boss is configured such that a portion of the fastener captured within the boss is entirely within a portion of the boss protruding from the top wall of the top case.

18. The housing as recited in claim 17, further comprising:
a bottom case coupled to the top case by a fastener coupled with one of the plurality of integral features.

* * * * *

UNITED STATES PATENT AND TRADEMARK OFFICE
CERTIFICATE OF CORRECTION

| | | |
|---|---|---|
| PATENT NO. | : 8,687,359 B2 | Page 1 of 1 |
| APPLICATION NO. | : 12/353242 | |
| DATED | : April 1, 2014 | |
| INVENTOR(S) | : Matthew Theobald et al. | |

It is certified that error appears in the above-identified patent and that said Letters Patent is hereby corrected as shown below:

In the Claims

Claim 1, Col. 17, line 61, "plurality of" should be deleted.

Claim 11, Col. 18, line 47, "plurality of" should be deleted.

Claim 11, Col. 18, line 53, "sidewalls" should be changed to --side walls--.

Claim 16, Col. 19, line 15, "plurality of" should be deleted.

Claim 16, Col. 19, line 21, "sidewalls" should be changed to --side walls--.

Signed and Sealed this
Twenty-second Day of July, 2014

Michelle K. Lee
*Deputy Director of the United States Patent and Trademark Office*